US009608081B2

(12) United States Patent
Tan et al.

(10) Patent No.: US 9,608,081 B2
(45) Date of Patent: Mar. 28, 2017

(54) SIMPLE AND COST-FREE MTP STRUCTURE

(71) Applicant: GLOBALFOUNDRIES Singapore Pte. Ltd., Singapore (SG)

(72) Inventors: Shyue Seng Tan, Singapore (SG); Yuan Sun, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/684,305

(22) Filed: Apr. 10, 2015

(65) Prior Publication Data
US 2015/0221663 A1 Aug. 6, 2015

Related U.S. Application Data

(63) Continuation-in-part of application No. 14/253,878, filed on Apr. 16, 2014, now Pat. No. 9,362,374.
(Continued)

(51) Int. Cl.
*H01L 27/115* (2006.01)
*H01L 29/423* (2006.01)
(Continued)

(52) U.S. Cl.
CPC .... *H01L 29/42328* (2013.01); *G11C 16/0433* (2013.01); *H01L 27/11558* (2013.01); *H01L 29/42324* (2013.01); *H01L 29/66825* (2013.01); *H01L 29/7881* (2013.01); *H01L 29/7883* (2013.01); *H01L 29/7885* (2013.01)

(58) Field of Classification Search
CPC ......... H01L 29/42328; H01L 29/66825; H01L 29/7881; H01L 29/7883; H01L 29/7885; H01L 27/11558; H01L 29/42324; G11C 16/0433
See application file for complete search history.

(56) References Cited

U.S. PATENT DOCUMENTS 5,841,165 A 11/1998 Chang et al.
6,044,018 A 3/2000 Sung et al.
(Continued)

FOREIGN PATENT DOCUMENTS

KR 100667215 B1 1/2007

OTHER PUBLICATIONS

L. Chang et al., Non-volatile memory device with true CMOS compatibility, Electronics Letters, Aug. 19, 1999, vol. 35, No. 17.
(Continued)

*Primary Examiner* — Long Pham
(74) *Attorney, Agent, or Firm* — Horizon IP Pte. Ltd.

(57) ABSTRACT

Embodiments of a simple and cost-free multi-time programmable (MTP) structure for non-volatile memory cells are presented. The memory cell includes a substrate, a first transistor having a select gate and a second transistor having a floating gate. The select and floating gates are adjacent to one another and disposed over a transistor well. The transistors include first and second S/D regions disposed adjacent to the sides of the gates. A control gate is disposed over a control well. The control gate is coupled to the floating gate and includes a control capacitor. An erase terminal is decoupled from the control capacitor and transistors.

20 Claims, 23 Drawing Sheets

Related U.S. Application Data

(60) Provisional application No. 61/839,879, filed on Jun. 27, 2013.

(51) Int. Cl.
*H01L 29/66* (2006.01)
*H01L 29/788* (2006.01)
*H01L 27/11558* (2017.01)
*G11C 16/04* (2006.01)

(56) References Cited

U.S. PATENT DOCUMENTS

| | | |
|---|---|---|
| 6,124,616 A | 9/2000 | Dennison et al. |
| 6,130,840 A | 10/2000 | Bergemont et al. |
| 6,166,954 A | 12/2000 | Chern |
| 6,211,548 B1 | 4/2001 | Ma |
| 6,452,835 B1 | 9/2002 | Diorio et al. |
| 6,711,064 B2 | 3/2004 | Hsu et al. |
| 6,727,149 B1 | 4/2004 | Krishnan et al. |
| 6,740,556 B1 | 5/2004 | Hsu et al. |
| 6,812,083 B2 | 11/2004 | Shen et al. |
| 6,819,594 B2 | 11/2004 | Lee et al. |
| 6,914,825 B2 | 7/2005 | Hsu et al. |
| 6,920,067 B2 | 7/2005 | Hsu et al. |
| 7,209,392 B2 | 4/2007 | Chen et al. |
| 7,391,647 B2 | 6/2008 | Fang et al. |
| 7,417,897 B2 | 8/2008 | Chen et al. |
| 7,423,903 B2 | 9/2008 | Lin et al. |
| 7,474,568 B2 | 1/2009 | Horch |
| 7,508,719 B2 | 3/2009 | Horch |
| 8,218,369 B2 | 7/2012 | Lin et al. |
| 8,305,808 B2 | 11/2012 | Lin et al. |
| 8,320,180 B2 | 11/2012 | Kalnitsky |
| 8,355,282 B2 | 1/2013 | Ching et al. |
| 8,384,155 B2 | 2/2013 | Lin et al. |
| 2007/0241392 A1 | 10/2007 | Lin et al. |
| 2008/0035973 A1 | 2/2008 | Lin et al. |
| 2009/0212342 A1 | 8/2009 | Roizin et al. |
| 2009/0267127 A1 | 10/2009 | Chen et al. |
| 2010/0238738 A1 | 9/2010 | Yoo et al. |
| 2011/0233643 A1 | 9/2011 | Chang |
| 2012/0236635 A1 | 9/2012 | Ching et al. |
| 2012/0236646 A1 | 9/2012 | Hsu et al. |
| 2013/0020626 A1 | 1/2013 | Tan et al. |
| 2013/0093012 A1 | 4/2013 | Zhang et al. |
| 2014/0015047 A1* | 1/2014 | Ng .............. H01L 21/82385 257/334 |
| 2015/0036437 A1* | 2/2015 | Li .................. G11C 16/10 365/185.33 |

OTHER PUBLICATIONS

Yanjun Ma et al., Reliability of pFET EEPROM With 70-Å Tunnel Oxide Manufactured in Generic Logic CMOS Processes, IEEE Transactions on Device and Materials Reliability, Sep. 2004, vol. 4, No. 3.

Albert Bergemont, Current limitations of floating gate NVM and new alternatives, Maxim Integrated Products, Apr. 10, 2007, EDS Meeting.

* cited by examiner

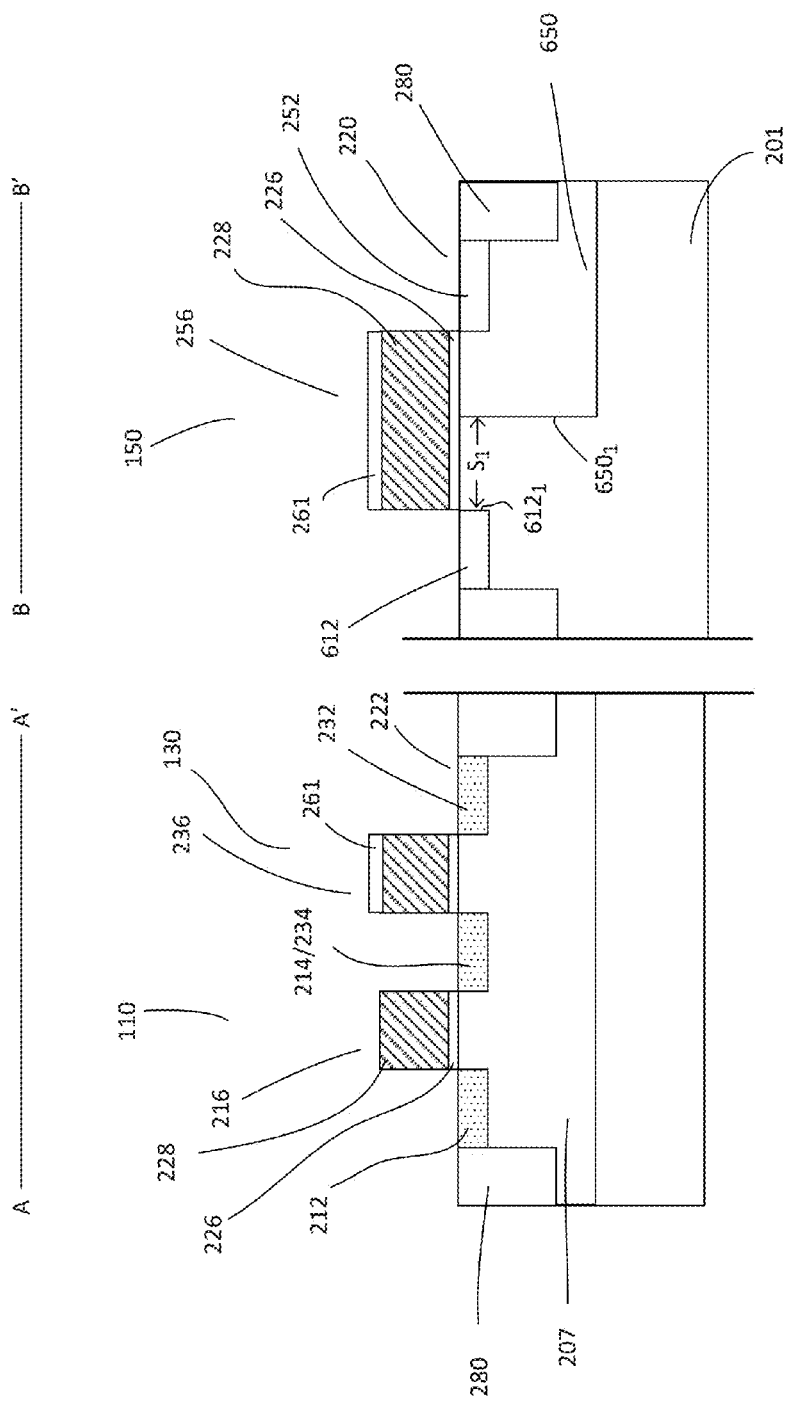

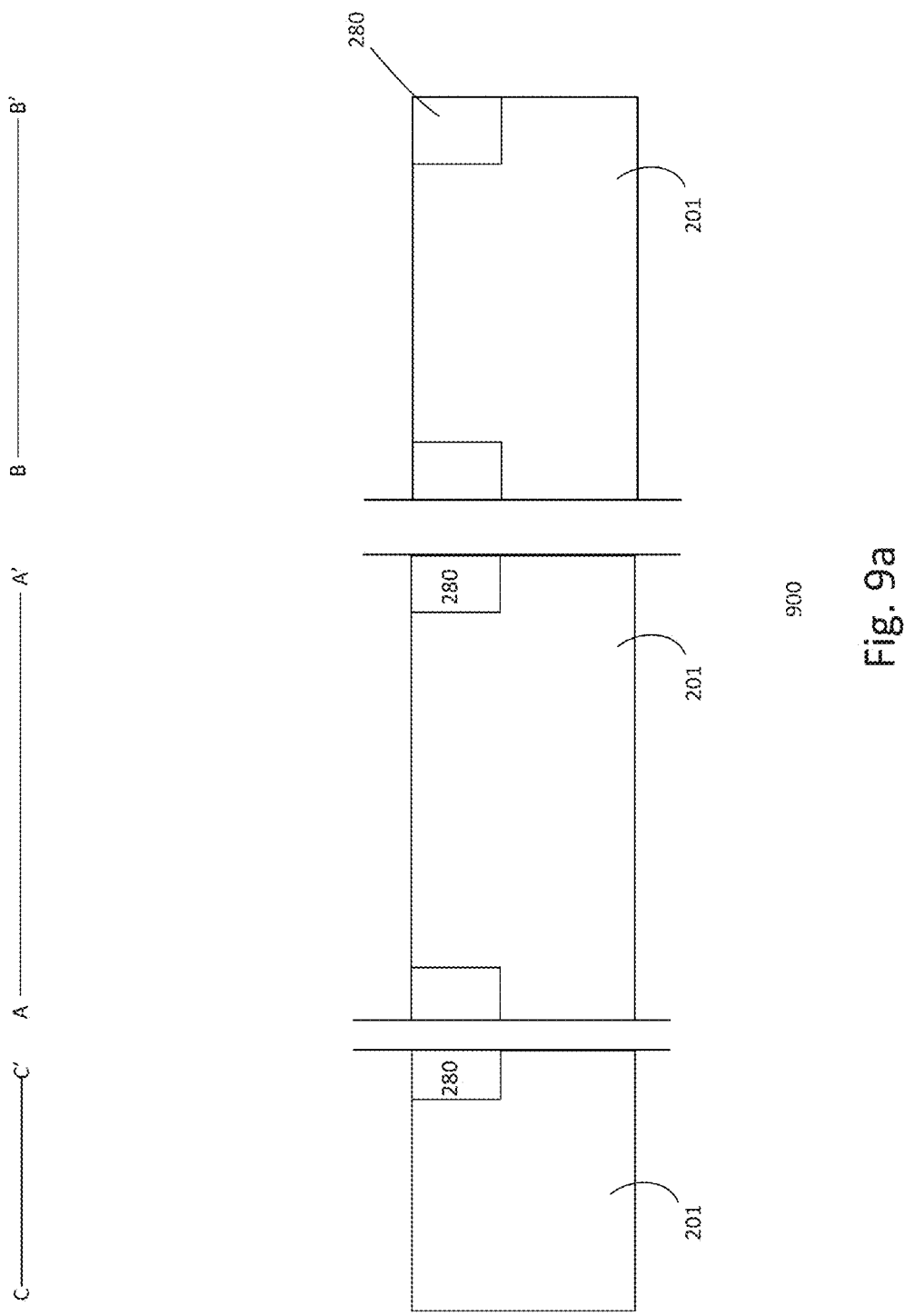

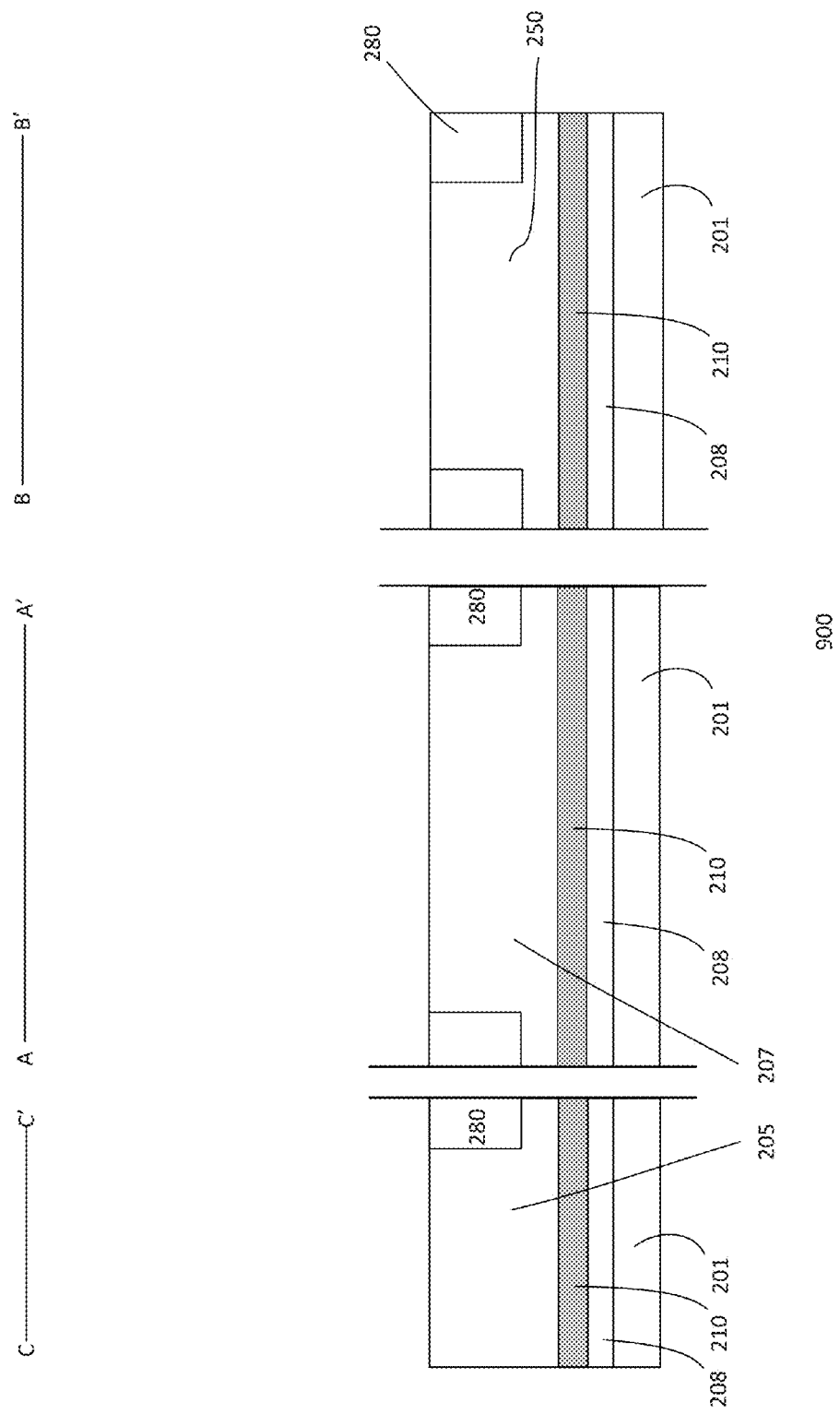

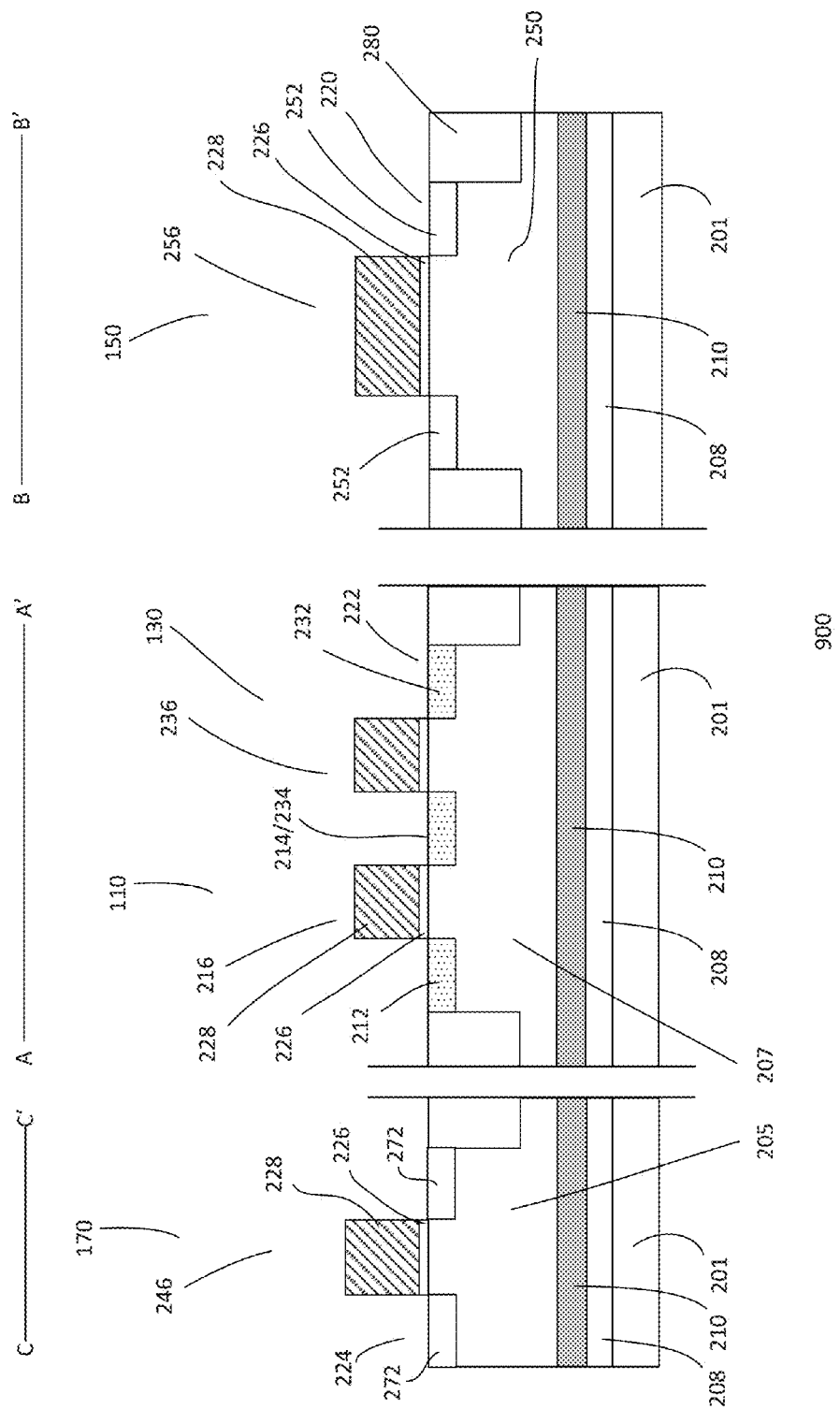

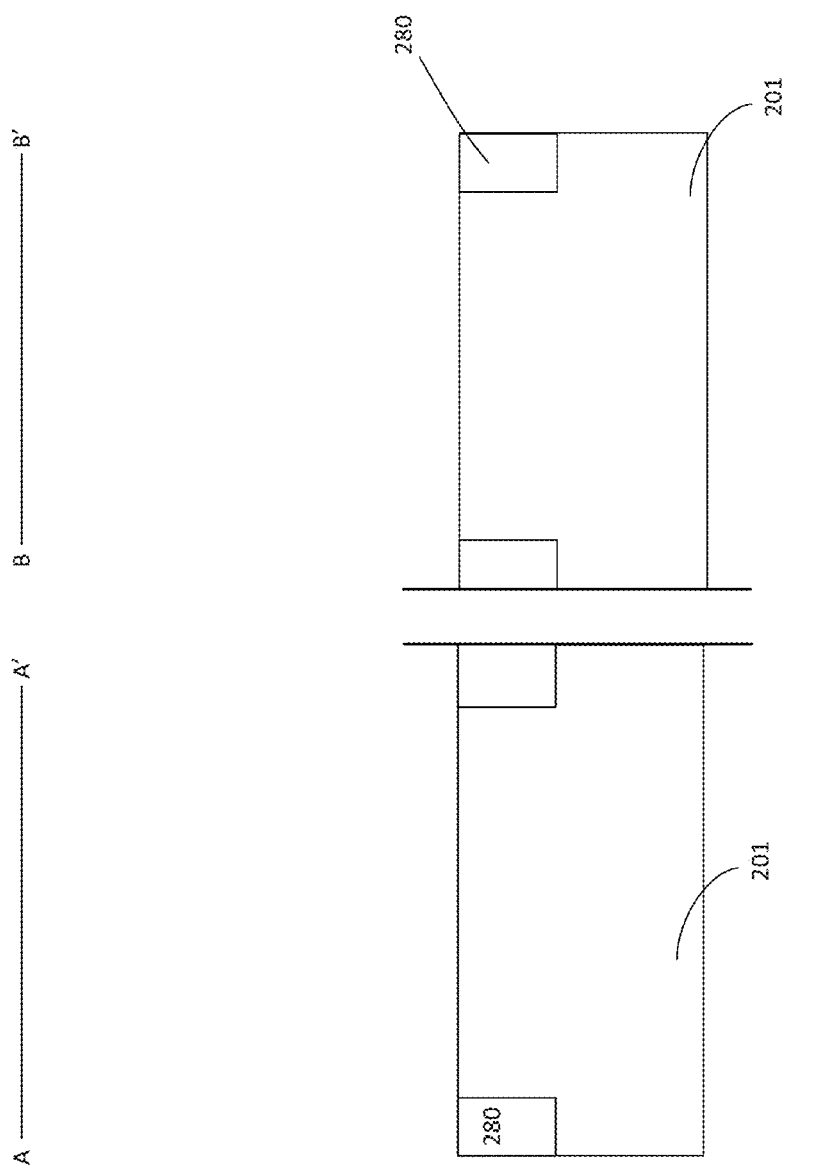

SIMPLE AND COST-FREE MTP STRUCTURE

CROSS-REFERENCE TO RELATED APPLICATIONS

This application is a continuation-in-part application of co-pending U.S. patent application Ser. No. 14/253,878, filed on Apr. 16, 2014, which claims the priority benefit of U.S. Provisional Application Ser. No. 61/839,879, filed on Jun. 27, 2013. In addition, this application is concurrently filed with and cross-references to application Ser. No. 14/684,298 entitled "SIMPLE AND COST-FREE MTP STRUCTURE" and application Ser. No. 14/684,311 entitled "SIMPLE AND COST-FREE MTP STRUCTURE". All disclosures are incorporated herewith by reference in their entireties for all purposes.

BACKGROUND

Multi-time programmable (MTP) memories have been recently introduced for beneficial use in a number of applications where customization is required for both digital and analog designs. These applications include data encryption, reference trimming, manufacturing identification (ID), security ID, and many other applications. Incorporating MTP memories nonetheless also typically comes at the expense of some additional processing steps. Some of the existing approaches to constructing MTP memories tend to suffer from slow access time, smaller coupling ratio and/or large cell size. Some of the existing approaches utilize band-to-band tunneling hot hole (BBHH) for erasing operation, but requires high junction band voltage and more process steps. Other existing approaches need additional coupling erase gate and coupling capacitor, and hence require more area.

Therefore, there is a need to provide a simple and cost-free MTP structure to create non-volatile memory cells with the standard complementary metal-oxide-semiconductor (CMOS) platform.

SUMMARY

Embodiments generally relate to a simple and cost-free MTP structure. In one embodiment, a non-volatile MTP memory cell includes a substrate, a first transistor having a select gate and a second transistor having a floating gate. The select and floating gates are adjacent to one another and disposed over a transistor well. The transistors include first and second S/D regions disposed adjacent to the sides of the gates. A control gate is disposed over a control well. The control gate is coupled to the floating gate and includes a control capacitor. An erase terminal is decoupled from the control capacitor and transistors.

In another embodiment, a non-volatile MTP memory cell is disclosed. The memory cell includes a substrate, a first transistor having a select gate and a second transistor having a floating gate. The select and floating gates are adjacent to one another and disposed over a transistor well. The transistors comprise first and second S/D regions disposed adjacent to the sides of the gates. A control gate is disposed over a control well. The control gate is coupled to the floating gate and includes a control capacitor. The control well includes a control contact region. The control contact region is disposed within the control well. An erase terminal is decoupled from the control capacitor and transistors.

In yet another embodiment, a method for forming non-volatile (NV) multi-time programmable (MTP) memory cell is disclosed. The method includes providing a substrate and forming at least first and second wells in the substrate. A first transistor having a select gate and a second transistor having a floating gate are formed adjacent to one another over the second well, the transistors include first and second diffusion regions formed adjacent to the sides of the gates. A control gate is formed over the first well. The control gate is coupled to the floating gate and the control and floating gates include the same gate layer extending across the first and second wells, and the control gate includes a capacitor. An erase terminal is formed. The erase terminal is decoupled from the control capacitor and transistors.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 6a shows a top view of other embodiments of a memory cell and FIGS. 6b-6c show various cross-sectional views of embodiments of the memory cell;

FIGS. 9a-9f show an embodiment of a process for forming a memory cell; and

FIGS. 10a-10f show another embodiment of a process for forming a memory cell.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
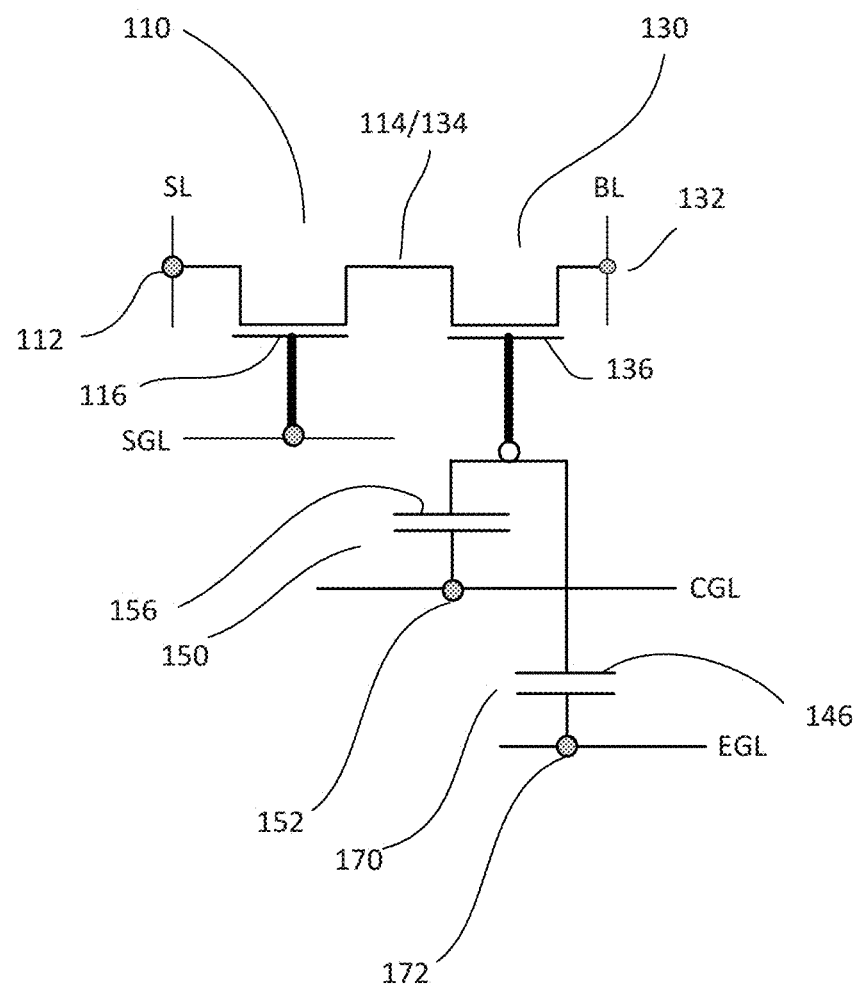
FIG. 1 shows a schematic diagram of an embodiment of a memory cell.

FIG. 1 shows a schematic diagram of an embodiment of a memory cell 100. The memory cell, in one embodiment, is a non-volatile (NV) multi-time programmable (MTP) memory cell 100. As shown in FIG. 1, memory cell 100 includes a first transistor 110, a second transistor 130, a first capacitor 150 and a second capacitor 170. In one embodiment, the second transistor functions as a storage element and the first capacitor functions as a voltage coupling element. The first and second transistors are, for example, metal oxide semiconductor (MOS) transistors. A transistor includes a gate between first and second source/drain (S/D) regions. The S/D regions of a transistor are heavily doped regions with first polarity type dopants. The polarity type determines the type of transistor. For example, the first polarity may be n-type for a n-type transistor or p-type for a p-type transistor.

A transistor S/D region, in one embodiment, may include S/D extension regions. S/D extension regions may include halo and lightly doped drain (LDD) regions (not shown). The halo region is a lightly doped region with second polarity type dopants. As for the LDD region, it is a lightly doped region with first polarity type dopants. For example, the halo region includes p-type dopants for a n-type transistor while the LDD region includes n-type dopants for n-type transistors. The dopant concentrations of the halo and LDD regions are lower than the transistor S/D region. In general, the dopant concentration of the LDD is heavier or higher than the halo region. For example, the dopant concentration of the halo region is about 1E12 $cm^{-2}$ and the dopant concentration of the LDD region is about 1E13 $cm^{-2}$. Providing other dopant concentrations for the LDD and halo regions may also be useful. For example, the dopant concentrations may be varied depending on the technology node. Other configurations of S/D extension region may also be useful. For example, providing a S/D extension region with only a LDD region without a halo region may also be useful.

A gate includes a gate electrode and a gate dielectric. The first transistor 110 serves as an access transistor while the second transistor 130 serves as a storage transistor. For example, the access transistor 110 includes a first access S/D region 112, a second access S/D region 114 and an access gate 116; the storage transistor 130 includes a first storage S/D region 132, a second storage S/D region 134 and a storage gate 136. The access gate 116 may be referred to as a select gate and the storage gate 136 may be referred to as a floating gate. The access and storage transistors 110 and 130 are coupled in series. For example, the second access S/D region and second storage S/D region 114 and 134 form a common S/D region of the transistors.

In one embodiment, the first and second capacitors 150 and 170 are MOS capacitors. A MOS capacitor, for example, includes a gate with a gate electrode and a gate dielectric. The first capacitor 150 is a voltage coupling (or control) capacitor while the second capacitor 170 is an erase capacitor. The control capacitor includes a control gate 156 and the erase capacitor includes an erase gate 146.

The control gate 156 forms the control capacitor 150. The control capacitor includes first and second control capacitor plates separated by a dielectric layer. The control gate electrode, for example, serves as the first (or control gate) control capacitor plate while a control well 250 which will be described later serves as the second (or control well) control capacitor plate. For example, a control gate dielectric layer disposed over the second control capacitor plate separates the first and second control capacitor plates. At least one control contact region 152 is disposed adjacent to the control gate. The control contact region is a heavily doped region. For example, the contact region is heavily doped with capacitor type dopants to minimize contact resistance. The control contact region 152 serves as a contact region to the control well. In one embodiment, the control gate is coupled to the storage gate. For example, the gates are formed from a common gate conductor.

The erase gate 146 forms the erase capacitor 170. The erase capacitor serves as an erase terminal of the memory cell. The erase capacitor includes first and second erase capacitor plates separated by a dielectric layer. The erase gate electrode, for example, serves as the first (or erase gate) erase capacitor plate while an erase well 205 which will be described later serves as the second (or erase well) erase capacitor plate. For example, an erase gate dielectric layer disposed over the second erase capacitor plate separates the first and second erase capacitor plates. At least one erase contact region 172 is disposed adjacent to the erase gate. The erase contact region is a heavily doped region. For example, the contact region is heavily doped with capacitor type dopants to minimize contact resistance. The erase contact region 172 serves as a contact region to the erase well. In one embodiment, the erase gate is coupled to the storage gate. For example, the gates are formed from a common gate conductor.

In one embodiment, the control and erase gates are commonly coupled to the storage gate. For example, the control and erase capacitors isolate the storage gate, making it a floating gate. Other configurations of the storage, erase and control gates may also be useful. In one embodiment, a common gate conductor couples the erase and control gates to the storage gate. For example, the same gate layers (i.e. gate dielectric and gate electrode layers) form the control gate 156, storage gate 136 and erase gate 146. In one embodiment, the same gate dielectric layer used for the storage, erase and control gates includes a thickness suitable for medium voltage devices. Other suitable thickness dimensions may also be useful.

The first access diffusion region 112 of first or access transistor 110 is coupled to a source line (SL) of the memory device. The first storage diffusion region 132 of second or storage transistor 130 is coupled to a bit line (BL) of the memory device. The access gate 116 of the first transistor 110, or the select gate of the memory cell 100, is coupled to a select gate line (SQL) of the memory device. The control well capacitor plate is coupled to a control gate line (CGL) of the memory device. The erase well capacitor plate of the erase capacitor is coupled to an erase gate line (EGL) of the memory device. In one embodiment, the SGL is disposed along a first direction, such as a wordline direction, while the BL is disposed along a second direction, such as the bitline direction. The first and second directions, for example, are orthogonal to each other. As for the CGL and EGL, they are disposed along the wordline direction and the SL is disposed along the bitline direction. Other configurations of BL, CGL, EGL, SGL and SL may also be useful. For example, the memory cells of a memory array may be commonly coupled to a common EGL while SL is separate for each column of memory cells.

Figure 2A:
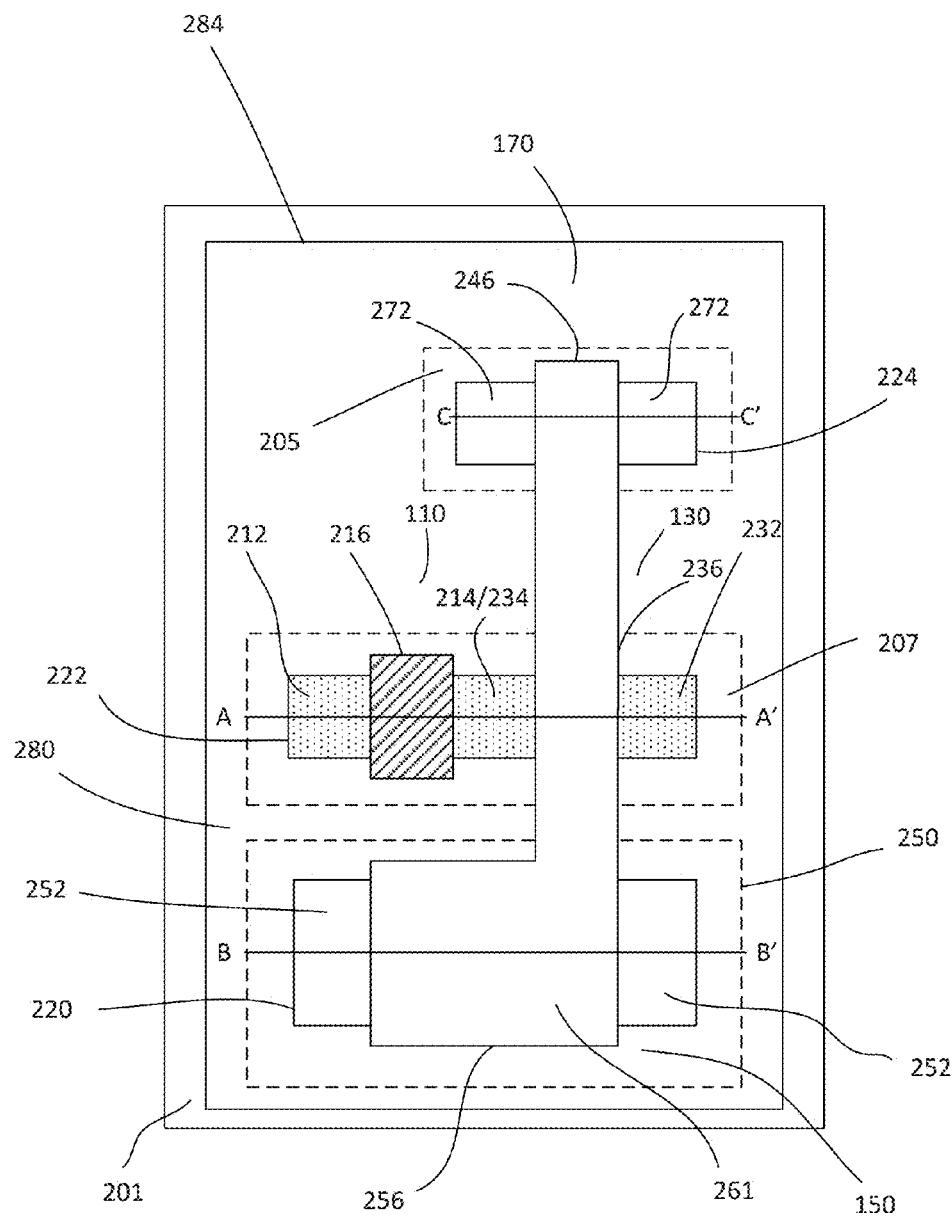
FIG. 2a shows a top view of an embodiment of a memory cell and FIG. 2b shows various cross-sectional views of an embodiment of the memory cell.
Figure 2B:
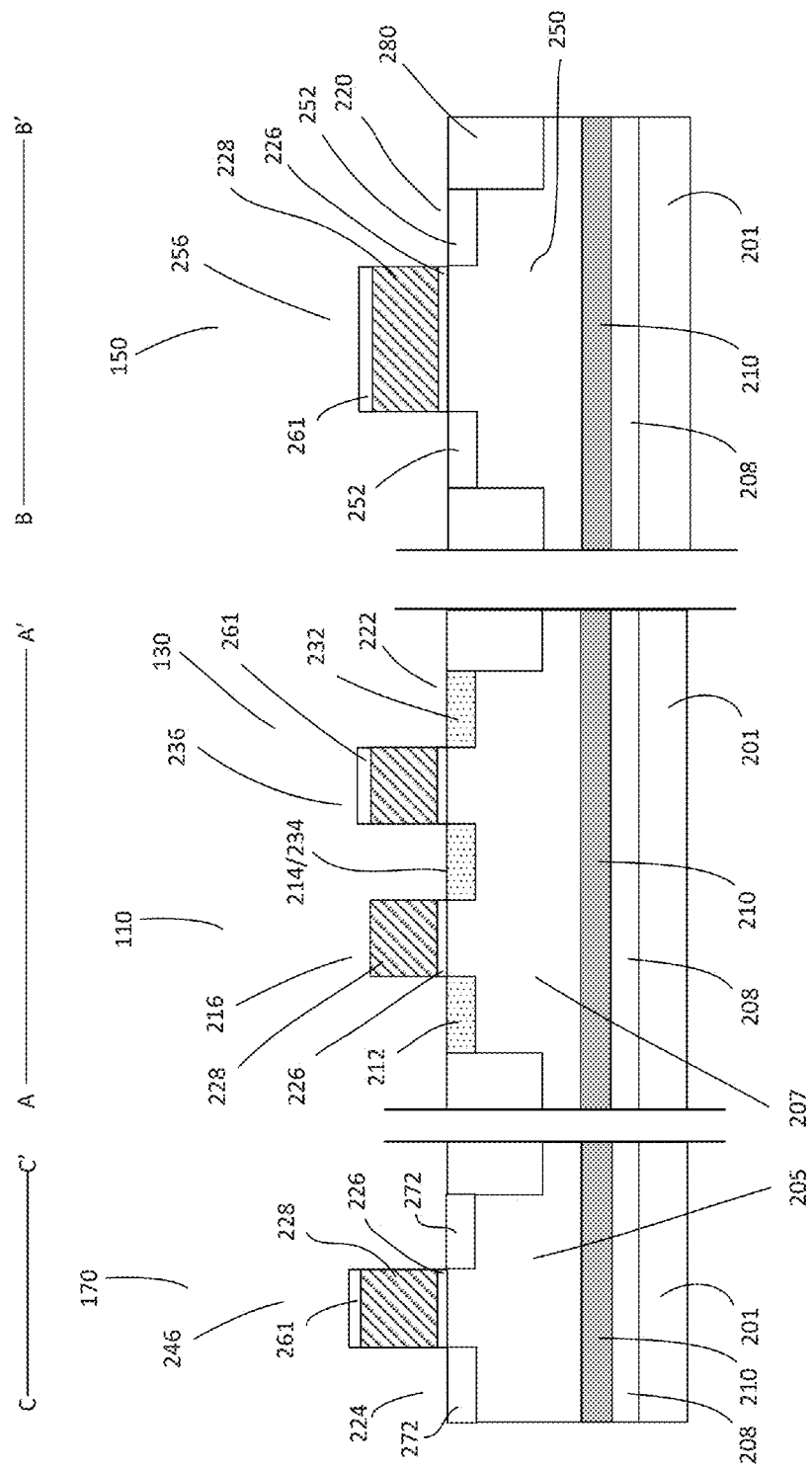

FIG. 2a shows a top view of an embodiment of a memory cell and FIG. 2b shows various cross-sectional views of an embodiment of the memory cell. The cross-sectional views are, for example, along A-A', B-B' and C-C of the memory cell. The memory device includes a memory cell 200. The memory cell is similar to that described in FIG. 1. Common elements may not be described or described in detail. The memory cell 200 as shown is a NVM cell. For example, the memory cell is a non-volatile MTP memory cell.

The device may include doped regions having different dopant concentrations. For example, the device may include heavily doped ($x^+$), intermediately doped (x) and lightly doped ($x^-$) regions, where x is the polarity type which can be p-type or n-type dopants. A lightly doped region may have a dopant concentration of about 1E11-1E12 cm$^{-2}$, an intermediately doped region may have a dopant concentration of about 1E12-1E13 cm$^{-2}$, and a heavily doped region may have a dopant concentration of about 1E13-1E14 cm$^{-2}$. Providing other dopant concentrations for the different types of doped regions may also be useful. For example, the dopant concentration range may be varied, depending on the technology node. P-type dopants may include boron (B), fluorine (F), aluminum (Al), indium (In) or a combination thereof, while n-type dopants may include phosphorous (P), arsenic (As), antimony (Sb) or a combination thereof.

The device is disposed on a substrate 201. The substrate is a semiconductor substrate, such as a silicon substrate. Other types of semiconductor substrates may also be useful. In one embodiment, the substrate 201 is a lightly doped substrate. In one embodiment, the substrate is lightly doped with dopants of a second polarity type. For example, the substrate is a lightly doped p-type (p$^-$) substrate. Providing a substrate doped with other types of dopants or undoped substrate may also be useful.

A cell region 284 is provided in the substrate. The cell region, for example, is a cell region in which the memory cell is disposed. Although one cell region is shown, the device may include a plurality of cell regions having memory cells interconnected to form a memory array. Additionally, the substrate may include other types of device regions, depending on the type of device or IC. For example, the device may include device regions for high voltage (HV), medium voltage (MV) and/or low voltage (LV) devices.

The cell region includes capacitor and transistor wells. The capacitor wells, for example, include a first well 205 for the erase capacitor 170 and a third well 250 for the control capacitor 150. In one embodiment, the first well serves as an erase well for an erase gate and the third well serves as a control well for a control gate while a second well 207 serves as a transistor well. For example, the transistor well serves as a well for access (or select) and storage transistors 110 and 130. The erase and control capacitors may be MOS capacitors. Other types of erase and control gates may also be useful.

As shown, the first, second and third wells are disposed adjacent to each other. The first well 205 accommodates the erase capacitor 170 and the second well 207 accommodates the access and storage transistors 110 and 130. The first or erase well includes capacitor type dopants and the second or transistor well includes transistor well type dopants. In one embodiment, the erase well is an intermediately doped well with capacitor type dopants. For example, the dopant concentration of the erase well may be about 1E12-1E13 cm$^{-2}$. As for the transistor well, it may be an intermediately doped well with transistor well type dopants. For example, the dopant concentration of transistor well type dopants in the transistor well may be about 1E12-1E13 cm$^{-2}$. Other capacitor and/or transistor well dopant concentrations may also be useful. In one embodiment, the first and second wells are tailored for MV and/or LV devices. For example, the first well is sufficiently doped to form a LV or MV device well while the second well is sufficiently doped to form a MV device well.

The third well 250 accommodates the control capacitor 150. In one embodiment, at least one control contact region 252 which minimizes contact resistance is disposed within the third well. The control contact region is a heavily doped region disposed within the third well which is a deep lightly doped region. For example, the third well encompasses the control contact region. The third well serves as a control well for a control gate and the control contact region serves as a contact region to the control well. A capacitor contact plug (not shown) is disposed above the control contact region. The capacitor contact plug, for example, may be a conductive contact plug, such as a tungsten contact plug. Other types of conductive contact plugs may also be useful. The capacitor contact plug, for example, couples the control well to the CGL of the memory device. The control gate includes a control capacitor. The control capacitor may be MOS capacitor. Other types of control gate may also be useful.

In one embodiment, the control well and the control contact region include same polarity dopants. The control well and the control contact region, for example, include capacitor type dopants. In one embodiment, the control well and the erase well include same polarity type dopants, such as capacitor type dopants. Other configurations of the control and erase wells may also be useful. For example, providing the control and erase wells with different polarity type dopants may also be useful. In one embodiment, the control well is lightly doped with capacitor type dopants. For example, the dopant concentration of the control well may be about 1E11 cm$^{-2}$. Other dopant concentrations for the control well may also be useful. In one embodiment, the control well is tailored for a HV device. For example, the control well is sufficiently doped to function as a HV device well.

The capacitor and transistor wells include a depth $D_W$. In one embodiment, the first well 205 includes a depth $D_{W1}$, the second well 207 includes a depth $D_{W2}$ and the third well 250 includes a depth $D_{W3}$. For example, the wells have a depth from the surface of the substrate to $D_{W1}$, $D_{W2}$ and $D_{W3}$. Although the first, second and third wells are illustrated to have about the same depth dimension from the surface of the substrate, it is to be understood that the wells may also include different depth dimensions. For example, $D_{W1}$, $D_{W2}$ and $D_{W3}$ may not be about equal to each other.

The polarity type of a capacitor well may depend on the polarity type of the capacitor. In one embodiment, the polarity type of the erase well depends on the polarity type of the erase capacitor and the polarity type of the control well depends on the polarity type of the control capacitor. For example, the control well dopant is p-type for a p-type MOS capacitor or n-type for a n-type MOS capacitor. In one embodiment, the erase and control capacitors are the same capacitor type. For example, the erase capacitor is p-type for a p-type control capacitor or n-type for a n-type control capacitor. Other configurations of erase and control capacitors may also be useful. For example, the erase capacitor may be p-type for a n-type control capacitor or n-type for a p-type control capacitor.

As for the transistor well dopants, it is the opposite polarity type to the transistor. In one embodiment, the transistor well dopants are second polarity type dopants for a first type transistor with first polarity type dopants. For example, the transistor well dopants are p-type for a n-type transistor. In one embodiment, the transistor well is of opposite polarity type to that of the control well. For example, a second polarity type transistor well is provided for a first polarity type control well. The first polarity type may be n-type and the second polarity type may be p-type. Other configurations of transistor and control wells may also be useful. For example, the first polarity type may be p-type and the second polarity type may be n-type.

An isolation well 208 may be provided in the substrate 201, as shown in FIG. 2b. The isolation well may be a deep isolation well disposed below the first, second and third wells. In one embodiment, the isolation well is a common isolation well of a memory chip. The isolation well, for example, encompasses a plurality of memory arrays of a memory chip. The isolation well includes isolation well dopants. In one embodiment, the isolation well is lightly doped with isolation well dopants. The isolation well dopants are, for example, opposite polarity type to the substrate type. In one embodiment, the isolation well dopants are first polarity type dopants for a second polarity type substrate. For example, a n-type isolation well is provided for a p-type substrate. Other configurations of isolation well and substrate may also be useful. The isolation well 208 serves to isolate the capacitor wells 205 and 250 and transistor well 207 from the substrate 201 to improve noise immunity of the memory device. The isolation well 208 has a depth $D_N$ from the surface of the substrate. The isolation well 208 may be referred to as the first isolation well.

In one embodiment, a HV well region 210 may be provided within the isolation well 208 in the substrate. In one embodiment, the HV well region encompasses the capacitor and transistor wells. For example, the HV well region separates the first, second and third wells 205, 207, 250 from the isolation well 208. In one embodiment, the HV well region is a common HV well region of a memory array. The HV well region, for example, encompasses a plurality of memory cells of a memory array. The HV well region includes HV well dopants. In one embodiment, the HV well region 210 is lightly doped with HV well dopants. The HV well dopants are, for example, opposite polarity type to the isolation well dopants. In one embodiment, the HV well dopants are second polarity type for first polarity type isolation well dopants. For example, a p-type HV well region is provided for a n-type isolation well. Other configurations of HV well region 210 and isolation well 208 may also be useful. In one embodiment, the HV well region 210 and third well 250 are doped with opposite polarity type dopants. For example, a p-type HV well region is provided for n-type isolation and control wells. The HV well region serves to improve isolation of the control well during device or programming operations. Providing a HV well region enables selective programming and reduces cell size layout. The HV well region has a depth $D_P$ from the surface of the substrate. The HV well region may be referred to as the second isolation well.

In one embodiment, $D_P$ is shallower than $D_N$ and deeper than $D_W$. In general, $D_W$ is less than $D_P$ which is less than $D_N$ ($D_W < D_P < D_N$). For example, $D_N$ may be about 1.8 μm while $D_P$ may be about 1.2-1.8 μm. Other suitable depth dimensions for $D_W$, $D_N$ and $D_P$ may also be useful.

A cell isolation region 280, as shown, separates the capacitor and transistor wells as well as the other device regions. In one embodiment, the cell isolation region 280 sufficiently overlaps the first, second and third wells 205, 207 and 250 to isolate the different wells. For example, the cell isolation region overlaps a portion of the different wells. In one embodiment, a bottom portion of the wells extends below the cell isolation region. For example, the first, second and third wells extend below and underlap the cell isolation region. Other configurations of the cell isolation region and wells may also be useful. The cell isolation region defines the active regions in the first, second and third wells. For example, the cell isolation region defines the active erase capacitor region 224, the active transistor region 222 and the active control capacitor region 220. The cell isolation region is, for example, a shallow trench isolation (SIT) region. Providing other types of isolation region between the wells may also be useful.

The cell isolation region has a depth $D_I$. For example, the cell isolation region has a depth from the surface of the substrate to $D_I$. In one embodiment, the cell isolation region has a depth which is shallower than the capacitor and transistor wells. For example, $D_I$ is less than the depth of the first, second and third wells and the HV well region ($D_I < D_W < D_P$). For example, $D_I$ may be about 0.5 μm while $D_W$ may be about 0.8-1.2 μm. Other suitable depth dimensions for $D_I$ and $D_W$ may also be useful.

Access and storage transistors are disposed on the active transistor region in the second or transistor well. A transistor includes a gate disposed between first and second S/D regions. The S/D regions, for example, include dopants of the same polarity type as the transistor type dopants. For example, p-type transistors have S/D regions with p-type dopants. The S/D regions, for example, are heavily doped regions. The gate is disposed on the substrate while the S/D regions are disposed adjacent to the gate in the active transistor region of the substrate. A gate includes a gate electrode 228 and a gate dielectric 226. The gate electrode 228, for example, may be a polysilicon gate electrode and the gate dielectric 226 may be a silicon oxide gate dielectric. Other types of gate electrode or dielectric materials may also be useful.

Dielectric spacers (not shown) may be provided on the gate sidewalk of the transistors. The spacers may be used to facilitate forming transistor S/D regions. For example, spacers are formed after S/D extension regions are formed. Spacers may be formed by, for example, forming a spacer layer on the substrate and anisotropically etching it to remove horizontal portions, leaving the spacers on sidewalls of the gates. After forming the spacers, an implant is performed to form the transistor S/D regions.

As discussed, the access transistor 110 includes first and second access S/D regions 212 and 214 heavily doped with transistor type dopants in the active transistor region 222 and an access gate 216 on the substrate. A transistor S/D region, in one embodiment, may include S/D extension regions (not shown) which extend beyond the S/D region to underlap a portion of the transistor gate. The access gate 216 includes an access gate electrode 228 over an access gate dielectric 226. The access gate may be referred to as a select gate. The storage transistor 130 includes first and second storage S/D regions 232 and 234 heavily doped with transistor type dopants in the substrate and a storage gate 236 on the substrate. The storage gate includes a storage gate electrode 228 over a storage gate dielectric 226. The storage gate may be referred to as a floating gate. The access and storage transistors 110 and 130 are coupled in series. In one embodiment, the second access S/D region 254 and second storage S/D region 234 form a common S/D region of the transistors. Other configurations of series connection for the access and storage gates may also be useful.

The control capacitor 150 is disposed on the control well 250. The control capacitor includes a control gate 256 disposed on the substrate over the active control capacitor region 220. The control gate includes a control gate electrode 228 over a control gate dielectric 226. The control gate electrode 228, for example, may be a polysilicon control gate electrode and the control gate dielectric 226 may be silicon oxide control gate dielectric. Other types of gate electrode or dielectric materials may also be useful. The control gate electrode, in one embodiment, is doped with control or capacitor type dopants. For example, the control gate electrode is heavily doped with same polarity type dopants as the control well.

At least one control contact region 252 is disposed in the active control capacitor region. For illustration purpose, two control contact regions are formed adjacent to the sides of the control gate. Other suitable number of control contact region may also be useful, depending on the desired cell size. In one embodiment, the control contact region is a heavily doped region disposed within the control well. The control contact region is, for example, a heavily doped region with a depth less than the control well. For example, the depth of the control contact region may be about 0.1-0.2 μm and the depth of the control well may be about 0.8-1.2 μm. Other suitable depth dimensions for the control well and control contact region may also be useful. In one embodiment, the control contact region is disposed adjacent to the control gate without underlapping the control gate. For example, the control contact region may be positioned away from the gate sidewalls and self-aligned with sidewall spacers on the sides of the control gate. Other configurations of the control contact region may also be useful. For example, the control contact region may be aligned to the sidewalls of the control gate.

The control contact region serves as a contact region to provide biasing for the control well. The control contact region, for example, improves the conductive connection between a conductive contact plug or well tap (not shown) and the control well. The control well serves as the second (or control well) control capacitor plate while the control gate electrode 228 serves as the first (or control gate) control capacitor plate. In one embodiment, the control gate electrode is doped before forming the control contact region. For example, a gate electrode layer deposited on the substrate is pre-doped with capacitor type dopants and patterned to form the control gate electrode.

The erase capacitor 170 is disposed on the first or erase well 205. The erase capacitor includes an erase gate 246 disposed on the substrate over the active erase capacitor region 224. The erase gate includes an erase gate electrode 228 over an erase gate dielectric 226. The erase gate electrode, for example, may be a polysilicon erase gate electrode and the erase gate dielectric may be silicon oxide erase gate dielectric. Other types of gate electrode or dielectric materials may also be useful. The erase gate electrode, in one embodiment, is doped with capacitor type dopants. For example, the erase gate electrode is heavily doped with same polarity type dopants as the control gate electrode. Other configurations of erase and control gate electrodes may also be useful. For example, the erase gate electrode may be doped with erase type dopants which are of a different polarity type to capacitor type dopants.

At least one erase contact region 272 is disposed in the active erase capacitor region. For illustration purpose, two erase contact regions are formed adjacent to the sides of the erase gate. Other suitable number of erase contact region may also be useful, depending on the desired cell size. In one embodiment, the erase contact region is a heavily doped region disposed within the erase well. The erase contact region is, for example, a heavily doped region with a depth less than the erase well. For example, the depth of the erase contact region may be about 0.1-0.2 μm and the depth of the erase well may be about 0.8-1.2 μm. Other suitable depth dimensions for the erase well and erase contact region may also be useful. The erase well serves as the second (or erase well) erase capacitor plate while the erase gate electrode 228 serves as the first (or erase gate) erase capacitor plate. In one embodiment, the erase gate electrode is doped before forming the conductive contact plug. For example, a gate electrode layer deposited on the substrate is pre-doped with capacitor type dopants and patterned to form the erase gate electrode. Providing an erase gate electrode with dopant types different from capacitor type dopants may also be useful. The erase capacitor 170 serves as an erase terminal of the memory cell.

Conductive contact plugs (not shown) may be disposed above the erase and control contact regions and adjacent to the erase and control gates. For example, the conductive contact plugs (or well taps) are coupled to the erase and control wells. The conductive contact plug above the control contact region, for example, couples the control well to CGL of the memory device while the conductive contact plug above the erase contact region, for example, couples the erase well to EGL.

In one embodiment, the erase gate, control gate and storage gate electrodes 228 are commonly coupled. In one embodiment, the erase gate 246, control gate 256 and storage gate 236 are formed of the same gate layers. For example, patterning the gate layers create the erase, control and storage gates. In such cases, the erase, control and storage gates are formed of the same material. For example, the gate electrode and dielectric layers of the erase and control gates are formed of the same material and thickness as the storage gate electrode and dielectric layers. In one embodiment, the same gate dielectric layer used for the storage, erase and control gates includes a thickness suitable for medium voltage devices. The gate electrodes are, for example, doped with capacitor type dopants. Providing gate electrodes with other dopant types may also be useful. In one embodiment, the access gate and floating gate are formed from the same gate layers. For example, the access gate is formed from the same gate layers as the erase, control and storage gates. Other configurations of the gates may also be useful. For example, the gates may be formed from different gate layers.

Metal silicide contacts (not shown) may be provided on contact regions of the memory cell. The metal silicide contacts, for example, may be nickel or nickel-based metal silicide contacts. Other suitable types of metal silicide contacts, including cobalt or cobalt-based metal silicide contacts, may also be useful. In one embodiment, metal silicide contacts are provided on the transistor S/D regions, active erase and control capacitor regions and the access gate. A silicide block 261 is disposed over the erase, storage and control gates. The silicide block, for example, is a dielectric material, such as silicon oxide or silicon nitride. Other types of silicide blocks may also be useful. Providing a silicide block over the erase, storage and control gates prevents formation of silicide contacts over these gates. This improves data retention.

The first access S/D region 212 is coupled to a SL of the memory device. The first storage S/D region 232 is coupled to a BL of the memory device. The access gate 216 is coupled to a SGL of the memory device. The control contact region 252 is coupled to a CGL of the memory device. The erase well 205 or second erase capacitor plate is coupled to an EGL of the memory device. In some embodiments, the control gate 256 is implemented as a control capacitor 550 and the erase gate 246 is implemented as an erase capacitor 170. In one embodiment, the SGL is disposed along a first direction, such as a wordline (WL) direction, while the bitline is disposed along a second direction, such as the bitline (BL) direction which is perpendicular to the WL direction. The CGL may be disposed along the wordline direction and the SL is disposed along the bitline direction. Other configurations of BL, CGL, SGL and SL may also be useful. For example, the memory cells of an array may be coupled to a common EGL disposed along a wordline direction while SL is separate for each column of memory cells in an array.

The various conductive lines of the memory cell may be disposed in metal levels of the device. Conductive lines disposed in the same direction may be provided in the same metal level. For example, conductive lines disposed along the BL direction may be disposed in metal level $M_X$ while conductive lines disposed along the WL direction may be disposed in $M_{X+1}$ of the device. Other configurations of conductive lines and metal levels may also be useful.

The memory cell as described has improved or more efficient programming due to increased capacitive coupling ratio. For example, the layout, of the control gate (CG) and floating gate (FG) can be designed to have an area ratio to produce the desired capacitive coupling ration. In some embodiments, an area ratio of CG:FG may be about 0.8:0.2. For example, width (W)×length (L) of the floating gate may be about 0.4×0.28, while W×L of the control gate may be about 1.6×0.84. Providing other CG:FG area ratios may also useful. By providing a large area for the control gate, a medium bias on the control well can be generated. This bias is transferred to the floating gate for efficient programming of the memory cell. Reducing the higher voltage required for the control well also allows a smaller control capacitor to be formed. This further reduces the size of the device.

Figure 3:
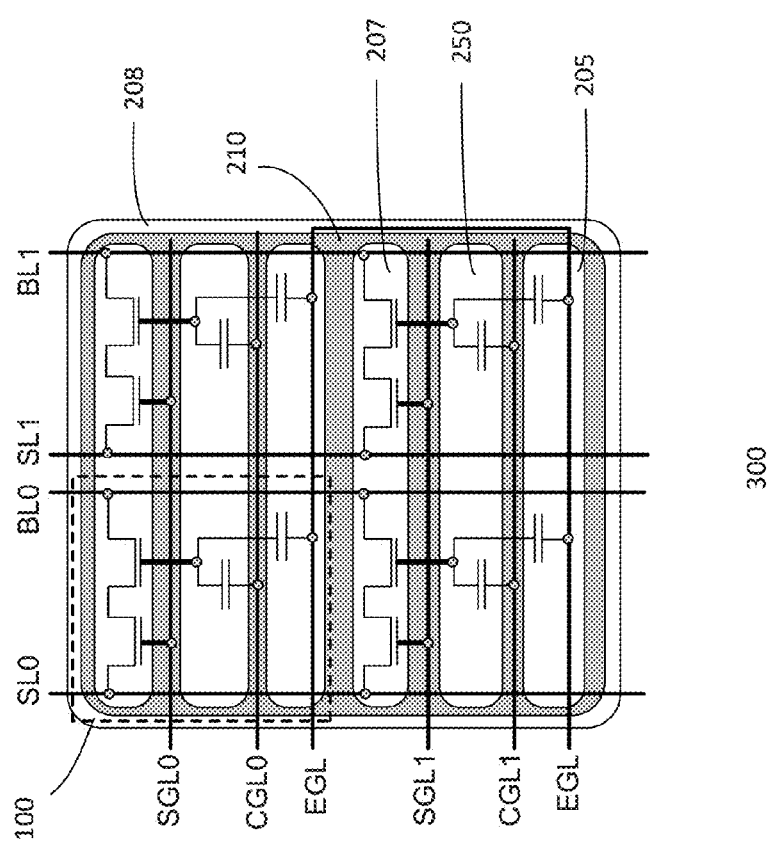
FIG. 3 shows a schematic diagram of an embodiment of a memory array.

FIG. 3 shows a schematic diagram of an embodiment of a memory array 300. A portion of the array is shown with, for example, four memory cells 100, such as those described in FIGS. 1 and 2a-2b. Common elements may not be described or described in detail. The array of memory cells may be formed on a substrate having active transistor and capacitor regions. In one embodiment, the active transistor region includes a transistor well 207 and the active capacitor regions include capacitor wells. For example, the active capacitor regions include erase and control wells 205 and 250. The different wells are disposed within a HV well region 210. The HV well region is, for example, surrounded by an isolation well 208 which is common to memory arrays of a memory chip. In one embodiment, the transistor and capacitor wells may extend across columns of interconnected memory cells of an array, as shown. For example, the transistors and capacitors of a memory array may be provided with common transistor and capacitor wells. Other configurations of the different wells may also be useful.

As shown, the memory cells are interconnected to form two columns connected by BLs (BL0 and BL1) and SLs (SL0 and SL1) and two rows of memory cells connected by SGLs (SGL0 and SGL1) and CGLs (CGL0 and CGL1). In one embodiment, the SLs (SL0 and SL1) of each column of memory cells are coupled to separate source terminals. For example, SL0 and SL1 are coupled to first and second source terminals and BL0 and BL1 are coupled to first and second bitline terminals. Coupling separate columns of memory cells to separate (or dedicated) source terminals form an AND-type array configuration. For example, the AND-type array configuration illustrated has access and storage transistors of each column coupled to separate SL and BL terminals respectively. Having an AND-type array configuration provides more reliable memory cell operation within an array.

In one embodiment, the rows of memory cells are connected by an EGL. For example, a common EGL is coupled to the memory cells of an array. The EGL, for example, is coupled to the erase terminals of the memory cells. Other configurations of EGL may also be useful. Erase operation is generally performed by block. Thus, a whole block of memory cells can share a common EGL.

Although a 2×2 portion of an array is shown, it is understood that the array may include numerous rows and columns. For example, the memory array may form a memory block.

Figure 4:
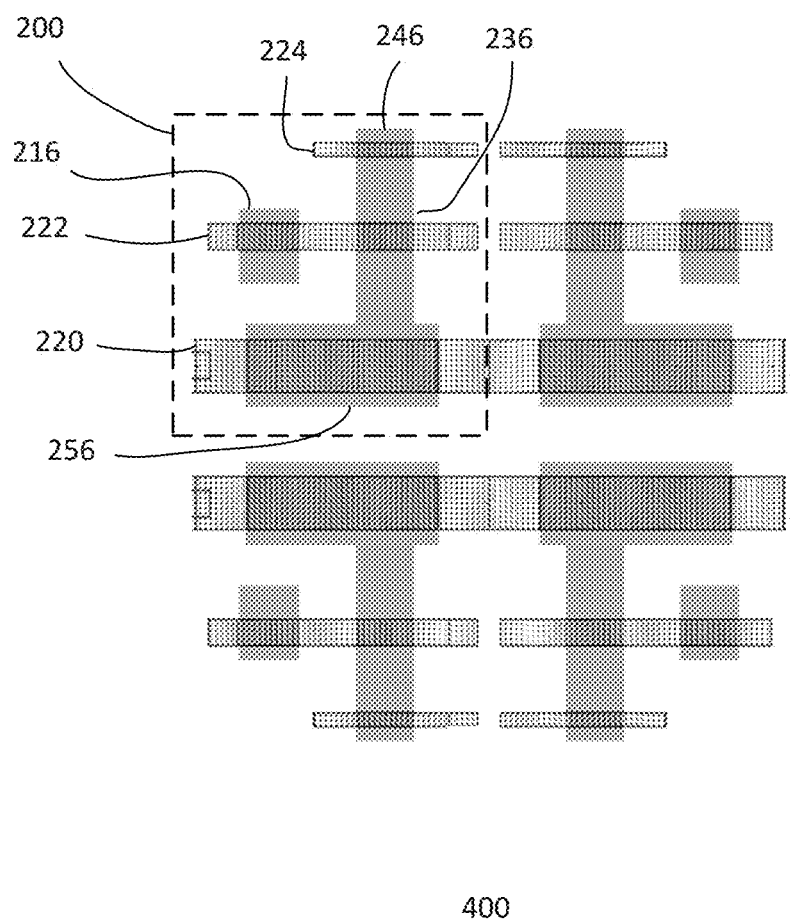
FIG. 4 shows a simplified plan view of an embodiment of a memory array.

FIG. 4 shows a simplified plan view of an embodiment of an array 400 of memory cells. The array is similar to that described in FIG. 3 and the memory cells 200 are similar to that described in FIGS. 2a-2b. Common elements may not be described or described in detail. The array of memory cells may be formed on a substrate having an isolation well, a HV well region and active transistor and capacitor regions.

The array 400, in one embodiment, includes a plurality of memory cells arranged in inverse orientations to each other. For example, the memory cells on first and second columns are mirror images of one another and the memory cells on first and second rows are mirror images of one another. Other suitable configurations of memory cells of an array may also be useful. Providing a mirror layout, as shown, allows neighboring memory cells in adjacent rows to share a common control well and reduces the footprint of a memory device.

The memory cell of FIGS. 1 and 2a-2b, in one embodiment, is configured to include first type transistors and first type capacitors. For example, the access and storage transistors are same polarity type to that of the erase and control capacitors. In one embodiment, the first type is n-type. For example, the memory cell is configured with n-type transistors and a n-type capacitor. In such cases, the transistor (or second) well 207 and capacitor (or first and third) wells 205 and 250 include opposite polarity type dopants. The transistor well includes second polarity type or p-type dopants while the erase and control wells include first polarity type or n-type dopants. The transistor S/D regions are n-type. Furthermore, the gate electrodes are doped with capacitor type dopants. For example, the gate electrodes are doped with first polarity type or n-type dopants. Other configurations of the memory cell may also be useful. For example, the memory cell may be configured to include first type transistors and first type control capacitor while the erase capacitor may be a second type capacitor different from the first type.

In one embodiment, a memory cell with first type transistors and first type capacitors may include various operating modes. The first type is, for example, n-type. The memory cell includes an erase and control capacitors coupled to a storage gate. In one embodiment, the memory cell includes separate erase, control and storage terminals. For example, the erase gate is provided with an erase well, the control gate is provided with a control well while the storage gate is provided with a separate transistor well. Such arrangement and configuration enable the erase operation and the program operation to be performed on different regions of the memory cell. For example, the erase and program operations will take place at different portions of the same gate dielectric layer shared by the storage, erase and control gates. As such, it decouples the program and erase operations and improves the endurance of the memory cell.

Table 1 below shows various biasing voltages at various terminals of a memory cell for program, erase and read operating modes:

TABLE 1

| | Signals | | | | | | | | | |
|---|---|---|---|---|---|---|---|---|---|---|
| | CGL | | EGL | | BL | | SL | | SG | |
| Modes | sel | unsel | sel | unsel | sel | unsel | sel | unsel | sel | unsel |
| PGM: FN (bit) | 18.5 | 0 V | 0 V | 0 V | 0 V | $V_{dd}$ | 0 V | $V_{dd}$ | $V_{dd}$ | $V_{dd}$ |
| ERS: FN (block or column) | 0 V | 0 V | 12.5 V | 12.5 V | 0 V | 0 V | 0 V | 0 V | 0 V | 0 V |
| Read | 3 V | 0 V | 0 | 0 | 1 V | 0 V | 0 V | 0 V | $V_{dd}$ | 0 V |

The values in Table 1 are exemplary using, for example, Fowler-Nordheim (FN) tunneling for program and erase operations. For example, the values are for an operating voltage $V_{dd}$ equal to about, 5V. Other suitable voltage values may also be useful.

The memory cell may operate in a Fowler-Nordheim (FN) tunneling program mode. To effect a FN tunneling program operation, the various select (sel) signals for such a program operation are provided at the various terminals of the selected memory cell. In the program mode, electron carriers tunnel through from the transistor well to the floating gate (FG). Other suitable types of programming modes, such as channel hot electron (CHE) injection programming mode, may also be useful. In the CHE programming mode, for example, electron carriers are injected from the transistor channel to the FG on the drain side.

The memory cell may operate in FN tunneling erase mode. To effect a FN tunneling erase mode, the various sel signals for such an erase operation are provided at the various terminals of the selected memory cell. In the erase mode, electron carriers move from the erase gate which is commonly coupled to the floating gate to the erase well. The erase mode may effect a memory block or column erase operation.

As for a read operation, the various sel signals for a read operation are provided at the various terminals of the selected memory cell to effect the read operation.

The memory cell as described in FIG. 1 and FIGS. 2a-2b result in advantages. The configuration and arrangement of the memory cell as described allows erase operation and the program operation to be performed on different regions of the memory cell, decoupling programming and erase operations. This improves endurance of the memory cell. In addition, FN tunneling program and erase modes allow for simplified charge pump design due to small programming current. Providing the select and storage transistors as medium voltage device, such as 5V device, avoids the risk of mix and matching LV with MV gate dielectric. The use of a common gate dielectric layer having a thickness suitable for medium voltage devices for the storage, erase and control gates simplifies and manufacturing process and also enhances the programming speed. Furthermore, by providing LV erase well adjacent to HV well region at the erase gate region and by providing HV control well adjacent to HV well region at the control gate region increase breakdown voltage. Thus, reliability of the memory cell is enhanced.

Figure 5:
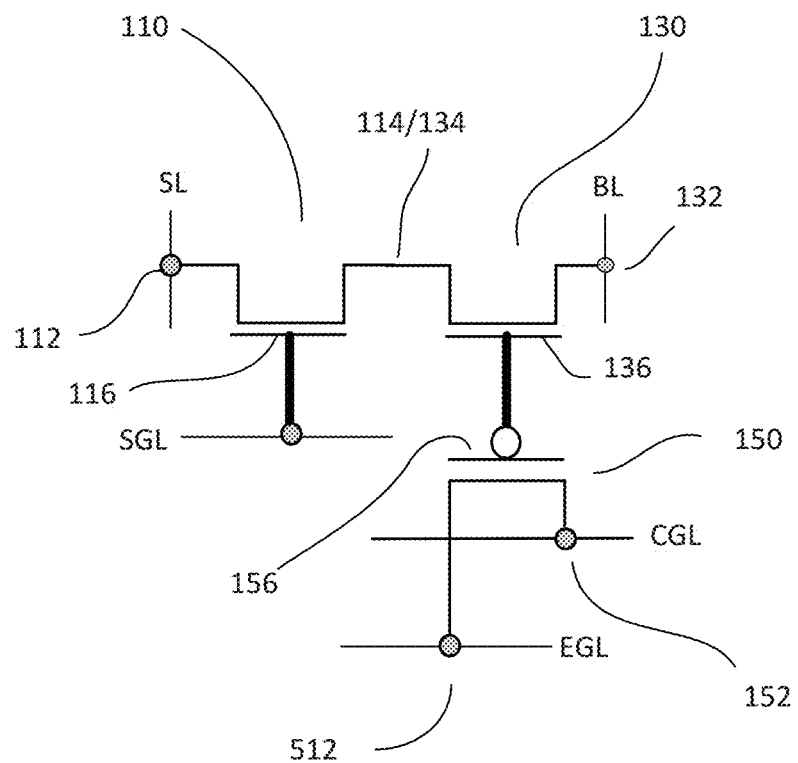
FIG. 5 shows a schematic diagram of another embodiment of a memory cell.

FIG. 5 shows a schematic diagram of another embodiment of a memory cell 500 of a memory device. The memory cell is similar to that described in FIG. 1. Common elements may not be described or described in detail. The memory cell 500 shown is a non-volatile memory cell. For example, the memory cell is a non-volatile MTP memory cell.

As shown, the memory cell includes first and second transistors 110 and 130 coupled in series and a control capacitor 150 coupled to the second transistor 130. A transistor includes a gate between first and second source/drain (S/D) regions. The S/D regions of a transistor include diffusion regions which are heavily doped with first polarity type dopants. The polarity type determines the type of transistor. For example, the first polarity type may be n-type for a n-type transistor or p-type for a p-type transistor.

A S/D region, in one embodiment, may include a S/D extension region which extends beyond the S/D region to underlap a portion of the transistor gate. A S/D extension region includes, for example, halo and lightly doped drain (LDD) regions (not shown). The LDD region is a lightly doped region with transistor type dopants. As for the halo region, it is a lightly doped region with opposite polarity type dopants to transistor type dopants. For example, the halo region includes p-type dopants for a n-type transistor while the LDD region includes n-type dopants for n-type transistors. Other configurations of S/D extension region may also be useful. For example, providing a S/D extension region with only LDD region without halo region may also be useful.

In one embodiment, the control capacitor is a MOS capacitor. The control capacitor 150 includes a control gate 156 with a control gate electrode and a control gate dielectric. The control gate 156 forms the control capacitor 150. The control capacitor includes first and second capacitor plates separated by a dielectric layer. The control gate electrode, for example, serves as the first (or gate) capacitor plate while a control well which will be described later serves as the second (or well) capacitor plate. For example, a dielectric layer disposed over the second capacitor plate separates the first and second capacitor plates. In one embodiment, the control gate is coupled to the storage gate. For example, the gates are formed from a common gate conductor. The control capacitor isolates the storage gate 136, making it a floating gate.

A control contact region 152 is disposed within the control well in the substrate on a first side of the control gate. In one embodiment, the control contact region is a heavily doped region. The control contact region is, for example, heavily doped with capacitor type dopants. The control contact region 152 serves as a contact region to the well capacitor plate. In one embodiment, an asymmetrical S/D region 512 is disposed in the substrate on a second side of the control gate. The asymmetrical S/D region, for example, underlaps a portion of the control gate. The asymmetrical S/D region may be referred to as an erase S/D region. Other configurations of asymmetrical S/D region and control contact region may also be useful. For example, the erase S/D region may be on a first side and the control contact region may be on a second side of the control gate. In one embodiment, the erase S/D region serves as an erase terminal. For example, the erase S/D region serves as an erase terminal of the memory cell.

The access and storage transistors 110 and 130 are coupled in series. For example, the second access S/D region and second storage S/D region 114 and 134 form a common S/D region of the first and second transistors. As for the control gate 156 and storage gate 136, they are commonly coupled. For example, a common gate electrode and a common gate dielectric are provided to form the storage gate and control gate. Other configurations of the storage and control gates may also be useful.

The first access S/D region 112 of first or access transistor 110 is coupled to a source line (SL) of the memory device. The first storage S/D region 132 of second or storage transistor 130 is coupled to a bit line (BL) of the memory device. The access gate 116 of the first transistor 110, or the select gate of the memory cell 100, is coupled to a select gate line (SGL) of the memory device. The control contact region 152 of the control capacitor is coupled to a control gate line (CGL) of the memory device. The asymmetrical S/D region 512 or erase S/D region is coupled to an erase gate line (EGL) of the memory device. In one embodiment, the SGL is disposed along a first direction, such as a wordline direction, while the BL is disposed along a second direction, such as the bitline direction. The first and second directions, for example, are orthogonal to each other. As for the CGL and EGL, they are disposed along the wordline direction and the SL is disposed along the bitline direction. Other configurations of BL, CGL, EGL, SGL and SL may also be useful. For example, the EGL may be commonly coupled to memory cells of an array while the SL is separate for each column of memory cells in an array. In the case of a common EGL, it may be disposed in a WL direction.

Figure 6A:
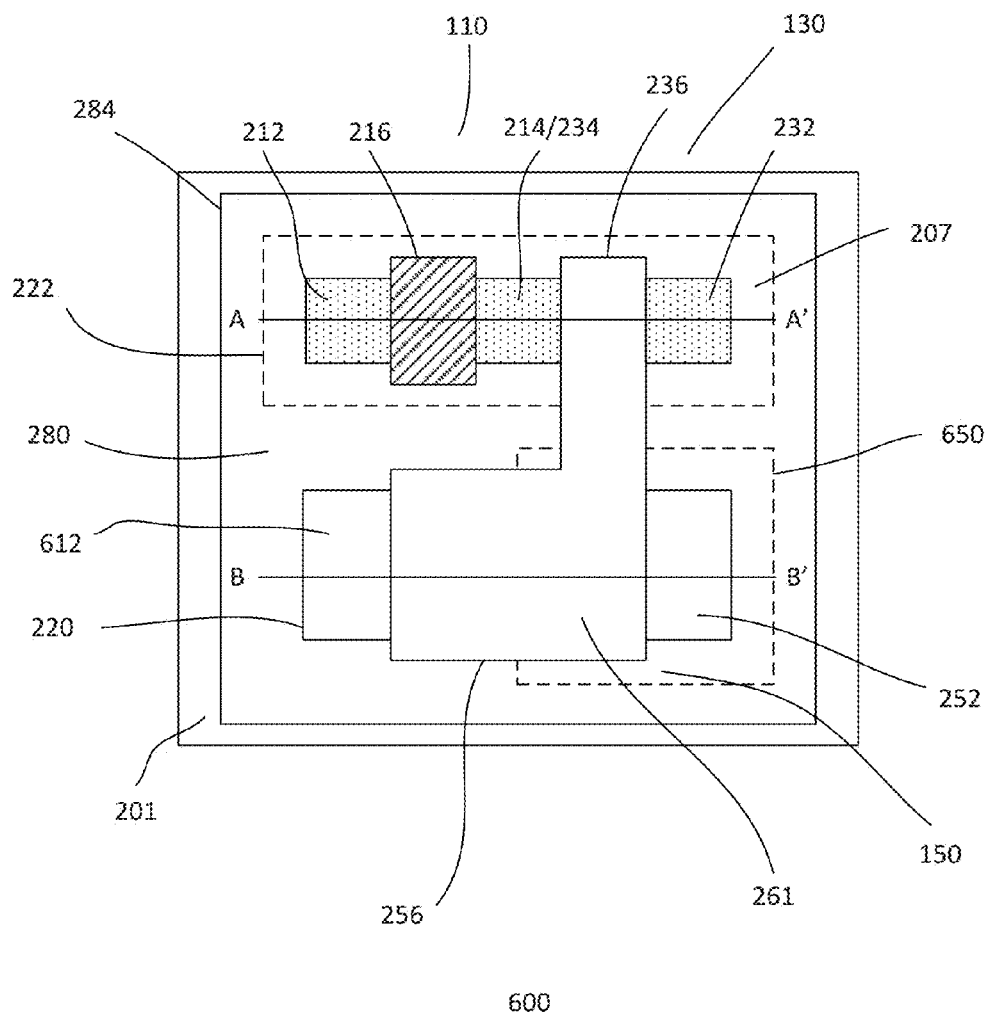
Figure 6C:
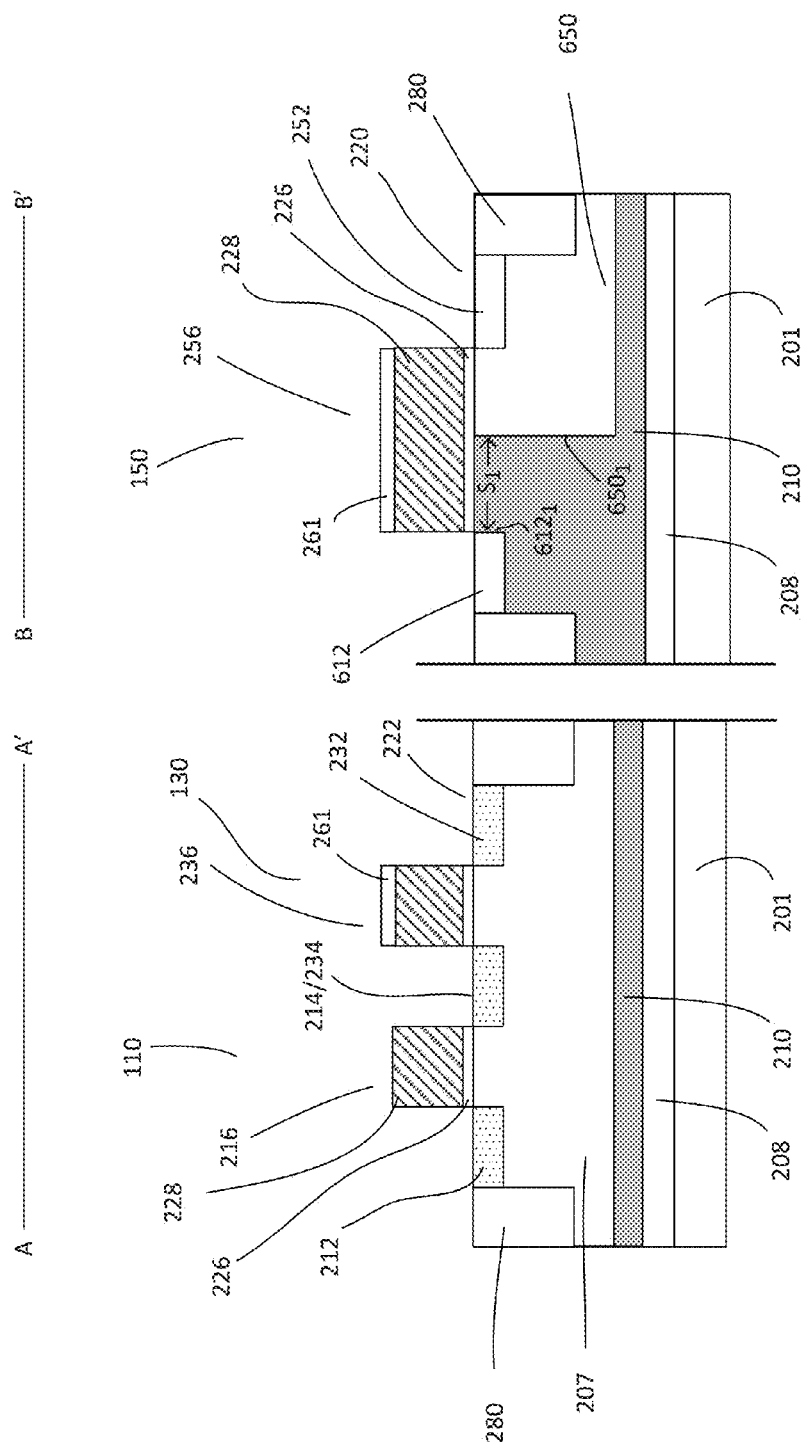

FIG. 6a shows a top view of various embodiments of a memory cell and FIG. 6b shows cross-sectional view of the memory cell of one embodiment while FIG. 6c shows cross-sectional view of another embodiment of a memory cell. The cross-sectional views are, for example, along A-A' and B-B' of the memory cell. The memory device includes a memory cell 600. The memory cell is similar to that described in FIGS. 1, 2a-2b and 5. Common elements may not be described or described in detail. The memory cell 600 as shown is a non-volatile memory cell. For example, the memory cell is a non-volatile MTP memory cell.

The device may include doped regions having different dopant concentrations. For example, the device may include heavily doped ($x^+$), intermediately doped (x) and lightly doped ($x^-$) regions, where x is the polarity type which can be p-type or n-type dopants. A lightly doped region may have a dopant concentration of about $1E11-1E12$ cm$^{-2}$, an intermediately doped region may have a dopant concentration of about $1E12-1E13$ cm$^{-2}$, and a heavily doped region may have a dopant concentration of about $1E13-1E14$ cm$^{-2}$. Providing other dopant concentrations for the different types of doped regions may also be useful.

The device is disposed on a substrate 201. The substrate is a semiconductor substrate, such as a silicon substrate. Other types of semiconductor substrates may also be useful. In one embodiment, the substrate 201 is a lightly doped substrate. In one embodiment, the substrate is lightly doped with dopants of a second polarity type. For example, the substrate is a lightly doped p-type ($p^-$) substrate. Providing a substrate doped with other types of dopants or undoped substrate may also be useful.

A cell region 284 is provided in the substrate. The cell region, for example, is a cell region in which the memory cell is disposed. Although one cell region is shown, the device may include a plurality of cell regions having memory cells interconnected to form a memory array. Additionally, the substrate may include other types of device regions, depending on the type of device or IC. For example, the device may include device regions for high voltage (HV), intermediate or medium voltage (MV) and/or low voltage (LV) devices.

The cell region includes first and second wells 650 and 207. The first well 650 serves as a control well for a control gate 256 while the second well 207 serves as a transistor well. For example, the transistor well serves as a well for access (or select) and storage transistors 110 and 130. In one embodiment, the control gate includes a control capacitor 150. The control capacitor may be MOS capacitor. Other types of control gates may also be useful.

The first or control well includes capacitor type dopants and the second or transistor well includes transistor well type dopants. In one embodiment, the transistor well is an intermediately doped well. For example, the dopant concentration of transistor well type dopants in the transistor well may be about, $1E12-1E13$ cm$^{-2}$. Other transistor well dopant concentrations may also be useful. The transistor well may be sufficiently doped to form a MV device well.

The control well 650 accommodates the control capacitor 150. In one embodiment, a first diffusion region or control contact region 252 is disposed within the control well. The control well and the control contact region, for example, are doped with capacitor type dopants. The control contact region is a heavily doped region disposed within the control well which is a deep lightly doped region. For example, the control well encompasses the control contact region. For example, the depth of the control contact region may be about 0.1-0.2 μm and the depth of the control well may be about 0.8-1.2 μm. Other suitable depth dimensions for the first and second diffusion regions may also be useful. The control contact region serves as a contact region to the control well and provides a biasing for the control well. The control gate includes a control capacitor. The control capacitor may be MOS capacitor. Other types of control gate may also be useful.

A cell isolation region 280, as shown, separates the first and second wells as well as other device regions. In one embodiment, the cell isolation region 280 sufficiently overlaps the first and second wells 650 and 207 to isolate the different wells. For example, the cell isolation region overlaps a portion of the first and second wells. The cell isolation region defines the active regions in the first and second wells. For example, the cell isolation region defines the active transistor region 222 in the second well 207 and the active capacitor region 220 in the first well 650. The cell isolation region is, for example, a shallow trench isolation (STI) region. Other types of isolation regions may also be useful.

In one embodiment, the active capacitor region includes a first diffusion region or control contact region 252 and a second diffusion region or an erase S/D region 612. In one embodiment, the control contact, region is disposed in the substrate adjacent to a first, side of the control gate. The erase S/D region is, for example, an asymmetrical S/D region in the substrate adjacent to a second side of the control gate. In one embodiment, the control well encompasses the control contact region and extends under the control gate to underlap a portion of the gate. The erase S/D region and control contact region are isolated from each other within the active capacitor region. In one embodiment, the control well may be displaced away from the erase S/D region by a substrate region disposed below the control gate. For example, a distance $S_1$ separates an inner edge $650_1$ of the control well from an inner edge of the erase S/D region $612_1$. $S_1$, for example, may be about 0.5 µm. Other suitable distances for $S_1$ may also be useful. The distance $S_1$ serves to isolate the control well from the erase S/D region in the substrate in the active capacitor region. In one embodiment, the erase S/D region 612 and control well 650 are disposed in a lightly doped substrate, as shown in FIG. 6b. For example, the substrate is an intrinsically doped substrate. The substrate 201 is, in one embodiment, devoid of an isolation well and HV well region. The intrinsically doped substrate serves as the substrate region isolating the erase S/D region and control well. Other substrate configurations may also be useful.

By providing an isolated erase S/D region 612 or erase terminal in the active capacitor region which is separated from the storage well and control well, the program and erase operations of the memory cell are decoupled. For example, such configuration allows different portions of the same gate dielectric layer to be used for erase and program operations. This leads to better endurance for the memory cell.

In an alternative embodiment, the substrate is provided with an isolation well 208 and a HV well region 210, as shown in FIG. 6c. In one embodiment, the substrate is lightly doped with second polarity type dopants for a first polarity type control capacitor. The HV well region is surrounded by the isolation well. In one embodiment, the HV well dopant is a second polarity type dopant for a first polarity type isolation well. For example, a p-type HV well region is provided for a n-type isolation well. Other configurations of HV well region and isolation well may also be useful. For example, the first polarity type may be p-type and the second polarity type may be n-type. The HV well region serves to improve isolation of the active capacitor regions from the substrate. For example, the HV well region is provided to electrically isolate first polarity type capacitors from a first polarity type isolation well. In the case where the HV well region 210 is provided in the substrate, the HV well region serves as the substrate region isolating the erase S/D region and control well.

In one embodiment, the active transistor region includes a transistor well 207. The transistor well accommodates the access and storage transistors. The control well includes capacitor type dopants and the transistor well includes transistor well type dopants. In one embodiment, the transistor well is tailored for MV devices and the control well is tailored for HV devices. For example, the control well is sufficiently doped to accommodate a HV device while the transistor well is sufficiently doped to accommodate a MV device well.

Dielectric spacers (not shown) may be provided on the gate sidewalk of the transistors and capacitor. The spacers may be used to facilitate forming S/D regions 212, 214, 234, 232, 612 and capacitor contact region 252. For example, spacers are formed after S/D extension regions are formed. Spacers may be formed by, for example, forming a spacer layer on the substrate and anisotropically etching it to remove horizontal portions, leaving the spacers on sidewalls of the gates. After forming the spacers, an implant is performed to form the S/D regions and capacitor contact region. For example, the S/D regions and control contact, region are self-aligned to a side of the sidewall spacers.

Metal silicide contacts (not shown) may be provided on contact regions of the memory cell. The metal silicide contacts, for example, may be nickel or nickel-based metal silicide contacts. Other types of metal silicide contacts may also be useful. In one embodiment, metal silicide contacts are provided on the transistor and erase S/D regions, control contact region and access gate. A silicide block 261 is disposed over the storage and control gates. The silicide block, for example, is a dielectric material, such as silicon oxide or silicon nitride. Other types of silicide blocks may also be useful. Providing a silicide block over the storage and control gates prevents formation of silicide contacts over the gates. This improves data retention.

The various conductive lines of the memory cell may be disposed in metal levels of the device. Conductive lines disposed in the same direction may be provided in the same metal level. For example, conductive lines disposed along the BL direction may be disposed in $M_X$ while conductive lines disposed along the WL direction may be disposed in $M_{X+1}$ of the device. Other configurations of conductive lines and metal levels may also be useful.

Figure 7B:
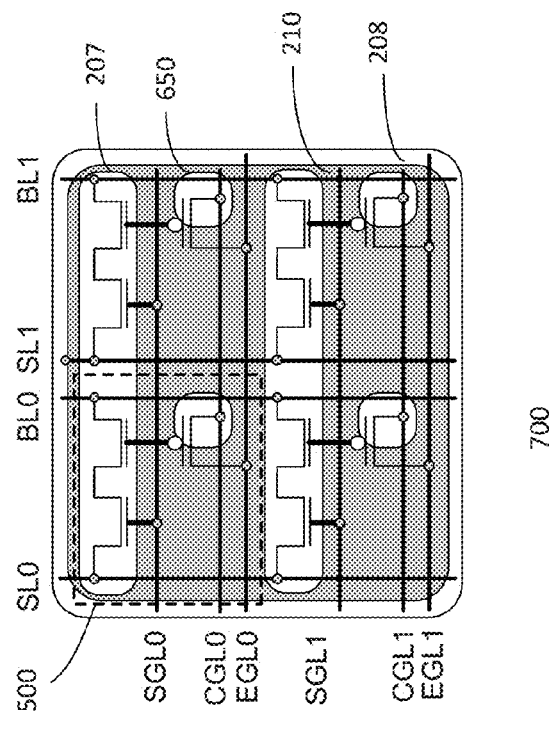
FIGS. 7a-7b show various schematic diagrams of other embodiments of a memory array.
Figure 7A:
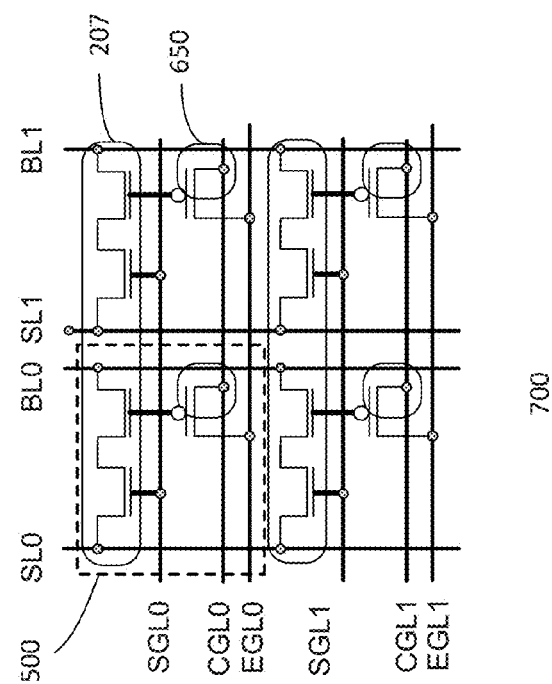

FIGS. 7a-7b show various schematic diagrams of other embodiments of an array 700 of memory cells. A portion of the array is shown with, for example, four memory cells 500, such as those described in FIGS. 5 and 6a-6c. Common elements may not be described or described in detail. The array of memory cells may be formed on a substrate having a transistor well 207 and a control well 650 disposed within a substrate. In one embodiment, the substrate is a lightly or intrinsically doped substrate, as shown in FIG. 7a. For example, the substrate is devoid of a HV well region and an isolation well.

In one embodiment, the transistor well 207 may be a common well which extends across columns of interconnected memory cells of an array. In one embodiment, separate control wells 650 are provided for each memory cell. For example, the control well encompasses only the control (or capacitor) contact region. Other configurations of transistor well and control well may also be useful.

As shown, the memory cells are interconnected to form two columns connected by BLs (BL0 and BL1) and SLs (SL0 and SL1) and two rows of memory cells connected by SGLs (SGL0 and SGL1), CGLs (CGL0 and CGL1) and EGL (EGL0 and EGL1). In one embodiment, the SLs (SL0 and SL1) of each column of memory cells are coupled to separate source terminals. For example, SL0 is coupled to a first source terminal and SL1 is coupled to a second source terminal. Other configurations for the array of memory cells may also be useful. For example, the array of memory cells may also be coupled to a common EGL within one block.

In another embodiment, the substrate may be provided with a HV well region 210, as shown in FIG. 7b. The HV well region is, for example, surrounded by an isolation well 208 which is common to memory arrays of a memory chip. In one embodiment, the HV well region encompasses the transistor and control wells 207 and 650.

Although a 2×2 portion of an array is shown, it is understood that the array may include numerous rows and columns.

Figure 8:
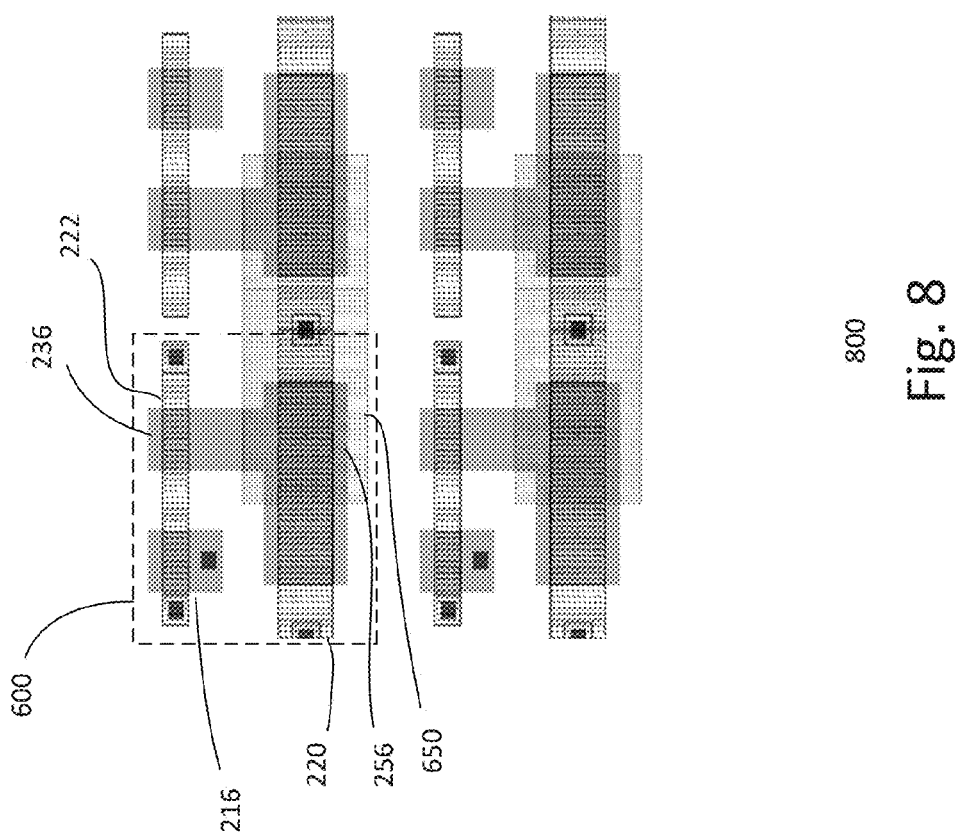
FIG. 8 shows a simplified plan view of another embodiment of a memory array.

FIG. 8 shows a simplified plan view of another embodiment of an array 800 of memory cells. The array is similar to that described in FIGS. 4 and 7 and the memory cells 600 are similar to that described in FIGS. 5 and 6a-6c. Common elements may not be described or described in detail.

The array 800, in one embodiment, includes a plurality of memory cells arranged in inverse orientations to each other. For example, the memory cells on first and second columns are mirror images of one another and the memory cells on first and second rows are mirror images of one another. Providing a mirror layout, as shown, allows neighboring memory cells in adjacent columns to share a common control well and reduces the footprint of a memory device.

The memory cell of FIGS. 5 and 6a-6c, in one embodiment, is configured to include first type transistors and a first type capacitor. For example, the access and storage transistors are same polarity type to that of the control capacitor. In one embodiment, the first type is n-type. For example, the memory cell is configured with n-type transistors and a n-type capacitor. In such cases, the transistor well 207 and control well 650 include opposite type dopants. The transistor well includes second polarity type or p-type dopants while the control well includes first polarity type or n-type dopants. The transistor S/D and asymmetrical S/D regions and the control contact region are both n-type. Furthermore, the gate electrodes are doped with capacitor type dopants. For example, the gate electrodes are doped with first polarity type or n-type dopants. Other gate configurations may also be useful.

In one embodiment, a memory cell with first type transistors and a first type capacitor may include various operating modes. The first type is, for example, n-type. In one embodiment, the memory cell includes an erase S/D region disposed in the active capacitor region. For example, the memory cell includes separate erase, storage and control terminals. For example, the erase S/D region is provided within the substrate or HV well region, the control gate is provided with a control well while the storage gate is provided with a separate transistor well which are separate regions from each other. Such arrangement and configuration enable the erase operation and the program operation to be performed on different regions of the memory cell. For example, the erase and program operations will take place at different portions of the same gate dielectric layer shared by the storage and control gates. As such, it decouples the program and erase operations and improves the endurance of the memory cell.

Table 2 below shows various signals at the various terminals of a memory cell for the different operating modes:

TABLE 2

| | Signals | | | | | | | | | |
|---|---|---|---|---|---|---|---|---|---|---|
| | CGL | | EGL | | BL | | SL | | SG | |
| Modes | sel | unsel | sel | unsel | sel | unsel | sel | unsel | sel | unsel |
| PGM: FN (bit) | 18.5 | 0 V | 0 V | 0 V | 0 V | 5 V | 0 V | 5 V | 5 V | 5 V |
| ERS: FN (block or column) | 0 V | 0 V | 12.5 V | 12.5 V | 0 V | 0 V | 0 V | 0 V | 0 V | 0 V |
| Read (in A) | 5 V | 0 V | 0 | 0 | 5 V | 0 V | 0 V | 0 V | 5 V | 0 V |

The values in Table 2 are exemplary using Fowler-Nordheim (FN) tunneling for program and erase operations. For example, the values are for an operating voltage $V_{dd}$ equal to about 5V. Other suitable voltage values may also be useful.

The memory cell may operate in a Fowler-Nordheim (FN) tunneling program mode and FN tunneling erase mode. To effect FN tunneling program or erase operations, the various sel signals for such operations are provided at the various terminals of the selected memory cell. As for a read operation, the various select (sel) signals for a read operation are provided at the various terminals of the selected memory cell to effect the read operation. In the program mode, electron carriers tunnel through from the transistor well to the floating gate (FG). To effect a FN tunneling erase mode, the various sel signals for such an erase operation are provided at the various terminals of the selected memory cell. In the erase mode, electron carriers move from the control gate which is commonly coupled to the floating gate to the erase S/D region. The erase mode may effect a memory block or column erase operation.

The memory cell as described in FIGS. 5 and 6a-6c may have the same or similar advantages as described for the memory cell of FIGS. 1 and 2a-2b. Thus, common advantages will not be described or described in detail. The configuration and arrangement of the memory cell as described in FIGS. 5 and 6a-6c is devoid of a separate erase capacitor or gate, further reducing the memory cell size. Furthermore, by providing erase S/D region adjacent to intrinsic p-type substrate or HV well region at the erase region and by providing HV control well adjacent to intrinsic p-type substrate or HV well region at the control gate region increase breakdown voltage. Thus, reliability of the memory cell is enhanced.

FIGS. 9a-9f show an embodiment of a process 900 for forming a memory cell described in FIGS. 2a-2b. Common elements may not be described or described in detail.

Referring to FIG. 9a, a substrate 201 prepared with one or more cell or device regions is provided. The substrate is lightly doped with second polarity type dopants, such as p-type dopants. Providing a substrate doped with other types of dopants or undoped substrate may also be useful. A device region is isolated from another device region by isolation regions, such as shallow trench isolation (STI) regions 280. In one embodiment, the isolation regions define active regions, such as the active transistor and capacitor regions. For example, isolation regions isolate the transistor and capacitor regions and other device regions, such as HV, MV and/or LV devices.

Various processes can be employed to form the STI regions 280. For example, the substrate can be etched using etch and mask techniques to form trenches. The mask, for example, includes a pad oxide and silicon nitride hard mask which is patterned using a patterned photoresist mask. The substrate is etched using, for example, an anisotropic etch, such as a reactive ion etch (RIE) to form the trenches. Other techniques for patterning the substrate may also be useful. The trenches are then filled with dielectric material, such as silicon oxide. Chemical mechanical polishing (CMP) can be performed to remove excess dielectric material and provide a planar substrate top surface. Other processes or materials can also be used to form the isolation regions.

The process continues to form various wells in the substrate. For example, the process continues to form isolation well 208, HV well region 210, first or erase well 205, second or transistor well 207 and third or control well 250 in various regions of the substrate as shown in FIG. 9b. The various wells are formed by implanting suitable dopant concentrations with suitable implant parameters to achieve desired depth dimensions of the various wells as described with respect to FIGS. 2a-2b. Other techniques for forming the various wells may also be useful.

Figure 9C:
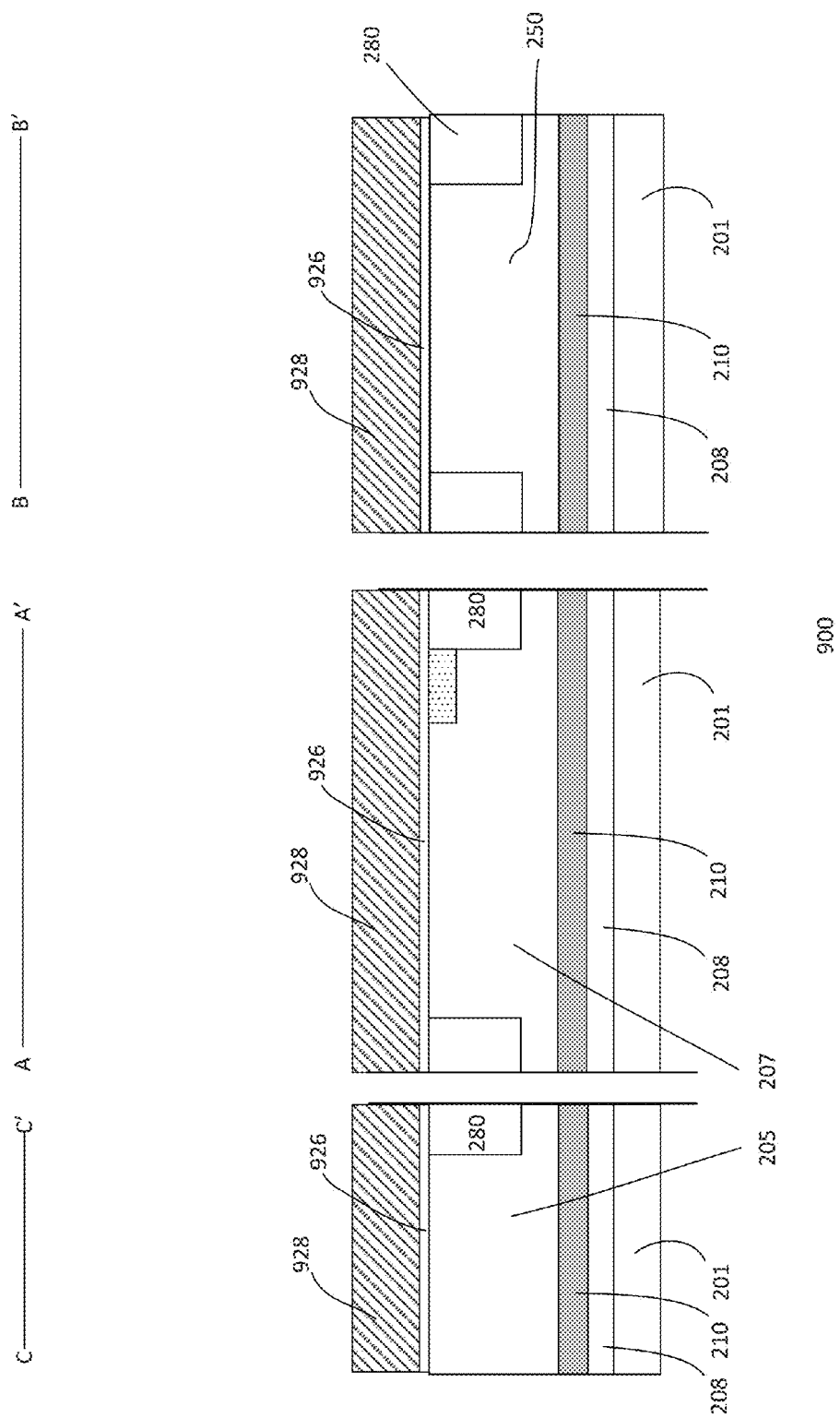

Device gates are formed on the substrate. A gate dielectric layer is deposited on the substrate and across the device regions to form gate dielectrics of the various devices. In one embodiment, a gate dielectric layer 926, such as a silicon oxide layer, is formed on the substrate, covering the first, second and third wells as shown in FIG. 9c. The gate dielectric layer, for example, includes a thickness suitable for medium voltage devices. Other suitable dielectric material and thickness dimensions may also be useful. In one embodiment, a gate electrode layer 928, such as a polysilicon layer, is deposited on the gate dielectric layer. The gate dielectric layer, for example, may be formed by thermal oxidation while the gate electrode layer, for example, may be formed by CVD. Other suitable techniques may also be employed.

Figure 9D:
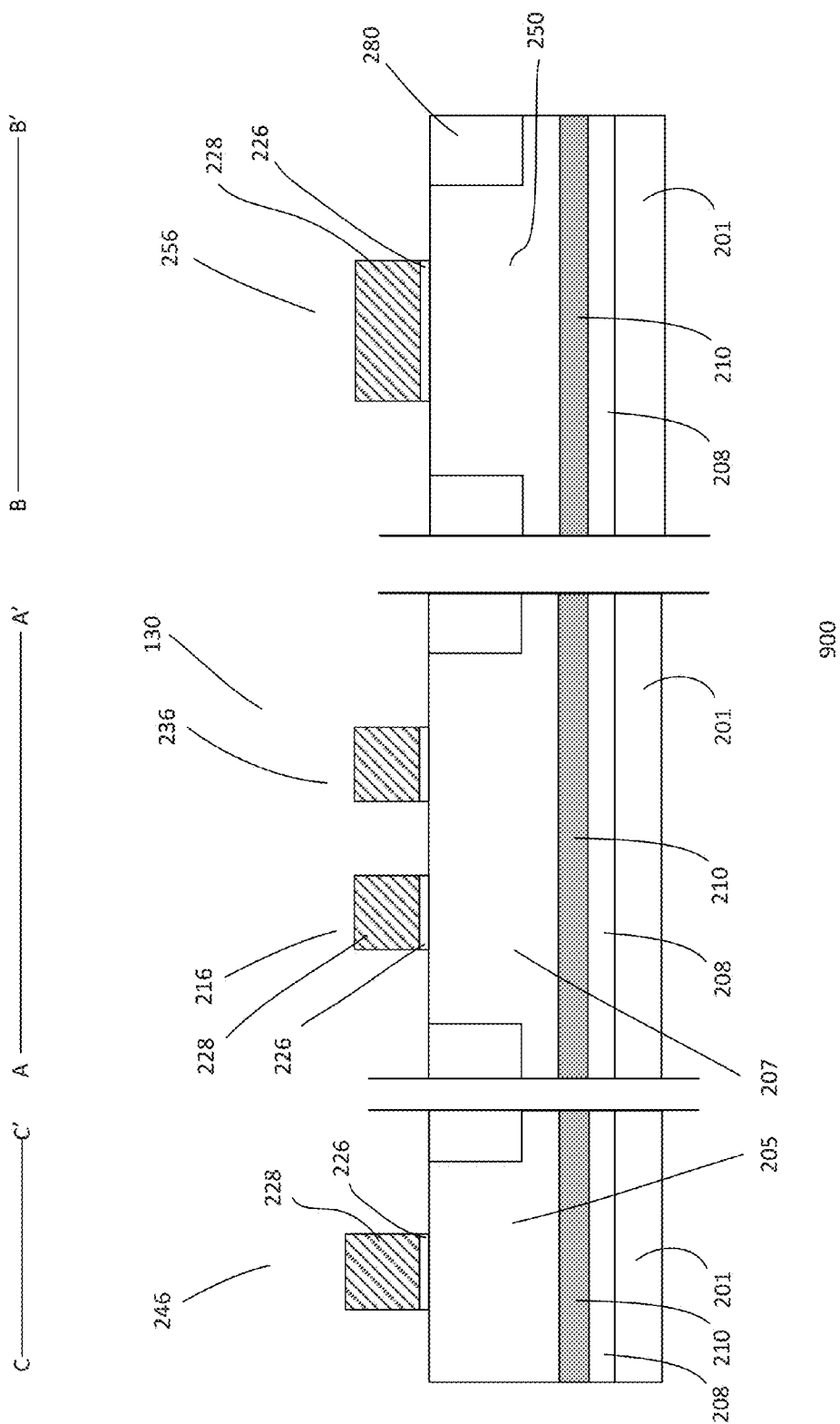

Referring to FIG. 9d, the process continues to pattern the gate dielectric and gate electrode layers. The gate electrode and gate dielectric layers are patterned to define gates of various devices. The patterned gate electrode and gate dielectric layers 228 and 226, in one embodiment, are configured such that the erase, storage and control gates are commonly coupled while the access gate is separately defined as shown in FIGS. 2a-2b. For example, the erase, storage and control gates 246, 236 and 256 are defined by single or common gate electrode and gate dielectric layers extending across the first, second and third wells while the access gate 216 is defined separately on the second well.

The process continues to form diffusion extension regions. In one embodiment, LDD and halo regions (not shown) are formed adjacent to the sides of the transistor gates extending under the gates. A common implant mask is employed, for example, to form the LDD and halo regions. For example, the implant mask is used to form halo regions in a first implant step and a second implant step is performed to form the LDD regions into the halo regions to form halo and LDD regions of the transistors. Other suitable techniques may also be used to form the halo and LDD regions. Providing LDD regions without halo regions may also be useful.

Gate sidewall spacers (not shown) are formed. A dielectric spacer layer may be deposited on the substrate and over the device regions. The dielectric spacer layer is patterned to form gate sidewall spacers on sidewalls of the gates. In one embodiment, the exposed substrate regions adjacent to the sidewall spacers are heavily doped with first or second polarity type dopants to form transistor S/D regions 212, 214, 232 and 234, erase contact region 272 and control contact region 252 as shown in FIG. 9e. Ion implantation technique may be employed to form the transistor S/D regions, erase contact region and control contact region with suitable dopant concentrations and depth dimensions as described with respect to FIGS. 2a-2b. An anneal may be performed thereafter to activate the dopants. This completes the formation of the transistors 110 and 130 and capacitors 150 and 170.

Figure 9F:
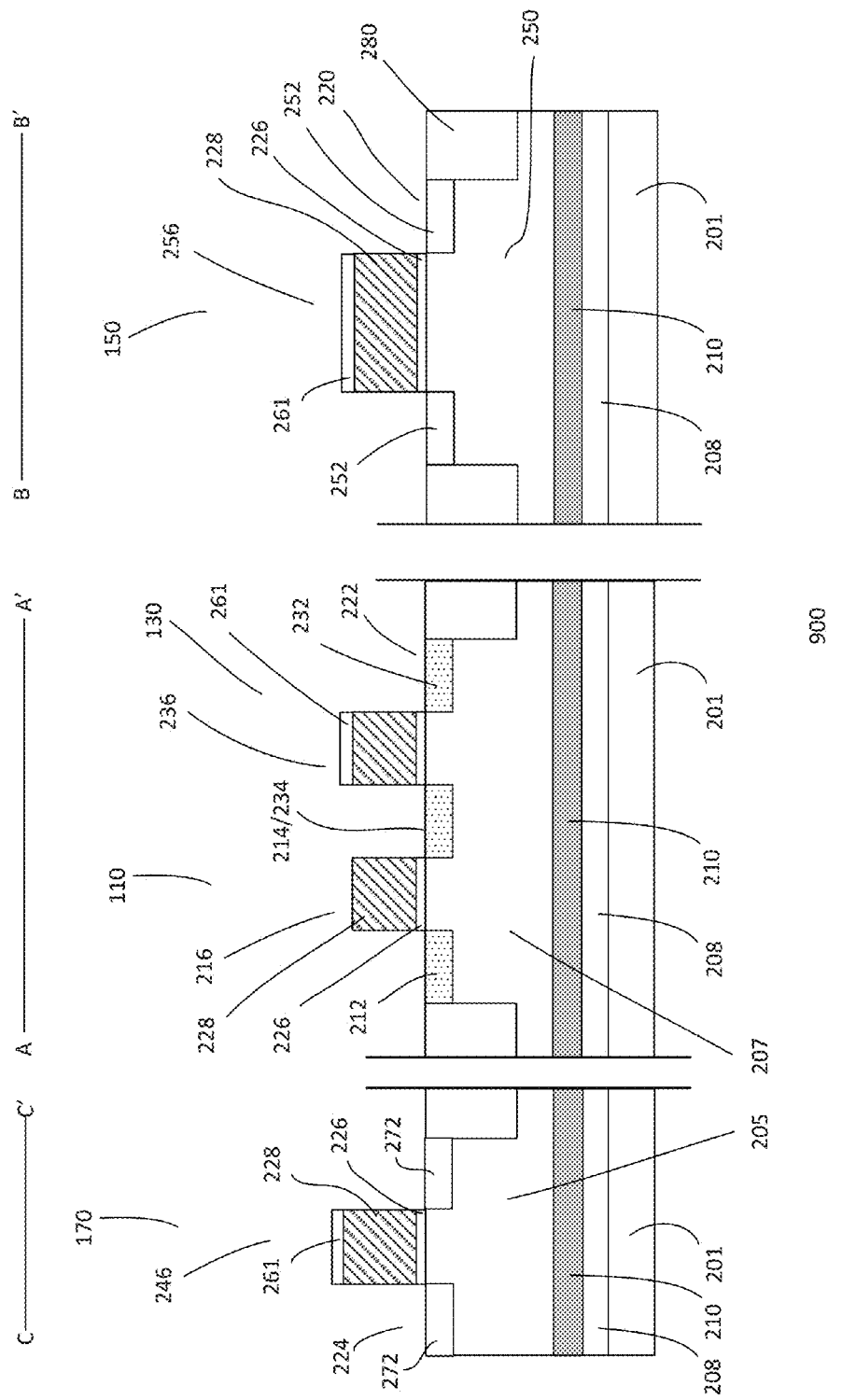

The process may continue to form a silicide block 261 over the erase, storage and control gates as shown in FIG. 9f. The silicide block, for example, is a dielectric material, such as silicon oxide or silicon nitride. Other types of silicide block materials may also be useful. Providing a silicide block over the erase, storage and control gates prevents formation of silicide contacts over these gates. Metal silicide contacts (not shown) may be provided on contact regions of the memory cell. For example, metal silicide contacts are provided on the transistor S/D regions, active capacitor regions and the access gate. The metal silicide contacts may be formed by suitable techniques.

The process continues to complete forming the device. The processing may include forming an interlayer dielectric (ILD) layer, conductive contact plugs coupled to the terminals of the memory cell, conductive contacts as well as one or more interconnect levels, final passivation, dicing, assembly and packaging. Other processes to complete forming the device may also be included.

FIGS. 10a-10f show another embodiment of a process 1000 for forming a memory cell described in FIGS. 6a-6b. The process 1000 may be similar to the process 900 as described in FIGS. 9a-9f. Common elements may not be described or described in detail.

Referring to FIG. 10a, a partially processed substrate is provided. The partially processed substrate is similar to that described in FIG. 9a. For example, the substrate 201 is prepared with STI regions 280.

Figure 10B:
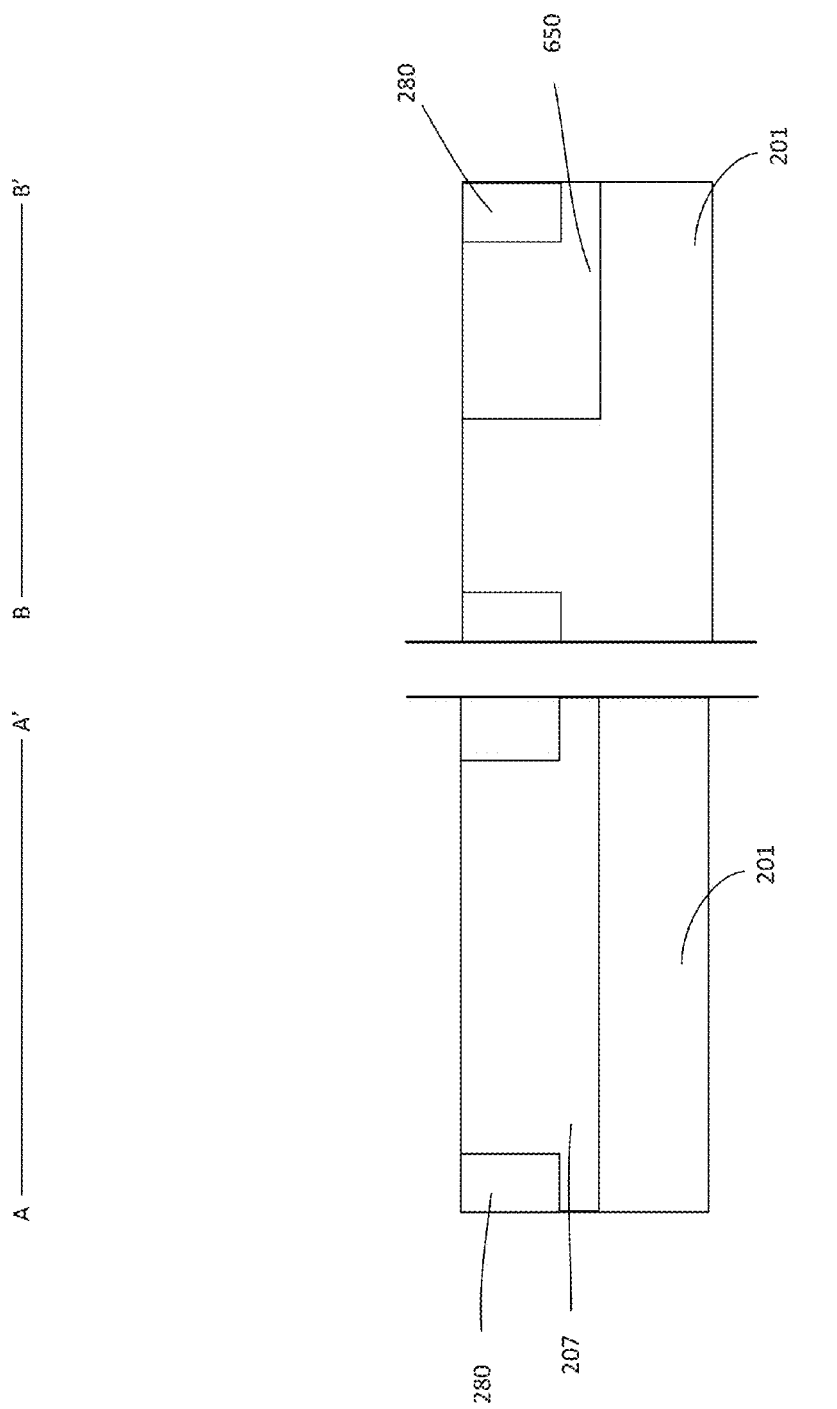

The process continues to form various wells in the substrate using suitable implant masks. For example, the process continues to form first or control well 650 and second or transistor well 207 in various regions of the substrate as shown in FIG. 10b. The various wells are formed by implanting suitable dopant concentrations with suitable implant, parameters to achieve desired depth dimensions of the various wells as described with respect to FIGS. 6a-6b. Other techniques for forming the various wells may also be useful. Suitable implant masks are employed to form the control and transistor wells. For example, an implant, mask may be used to define the transistor well while another implant mask covering the transistor well and a portion of the substrate adjacent to the transistor well is used to form the control well such that it is displaced away from the transistor well by the portion of the substrate or a substrate region.

Figure 10C:
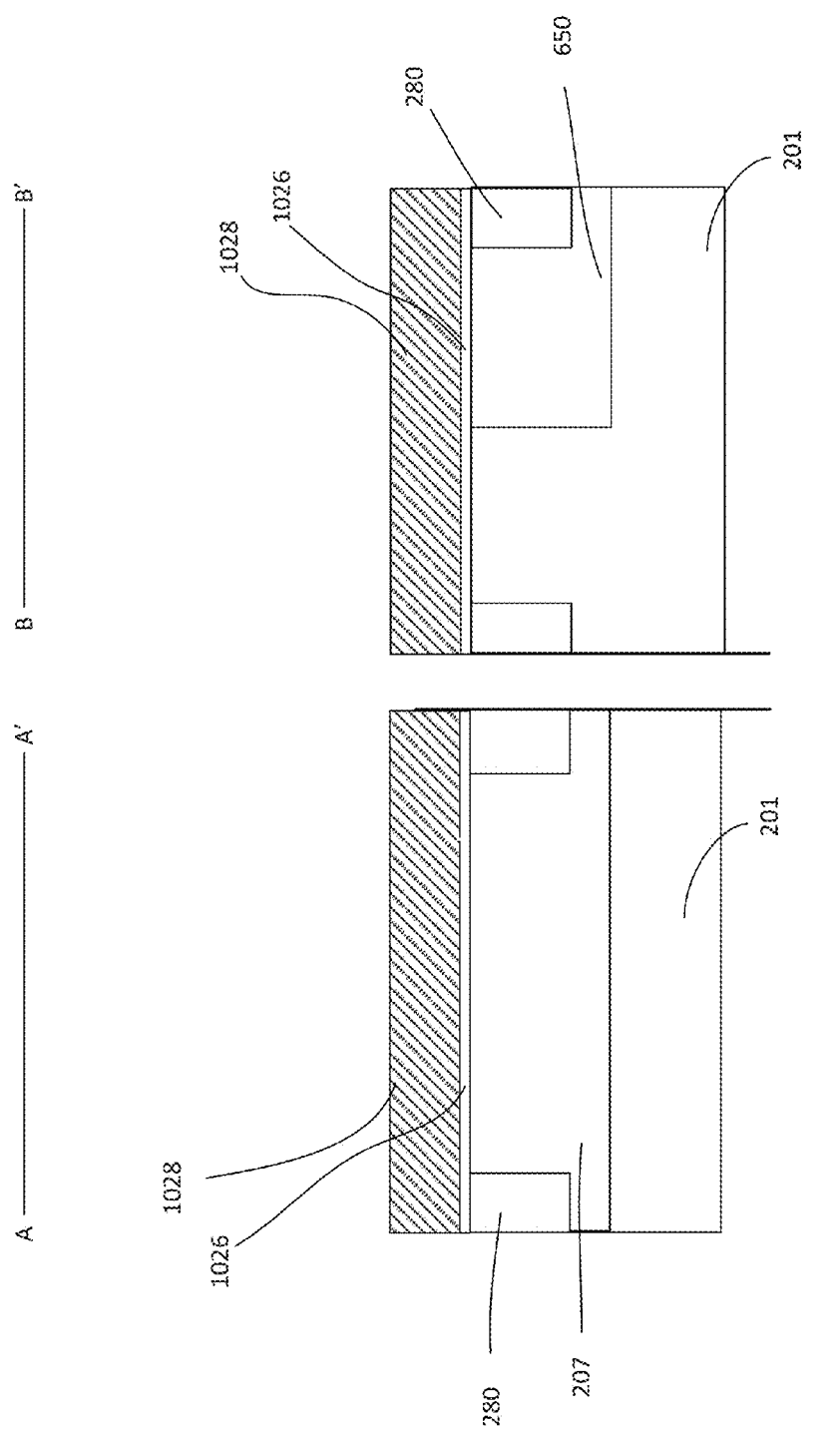

Device gates are formed on the substrate. A gate dielectric layer is deposited on the substrate and across the device regions to form gate dielectrics of the various devices. In one embodiment, a gate dielectric layer 1026 is formed on the substrate, covering the first and second wells as well as the substrate region which displaces the first well from the second well as shown in FIG. 10c. A gate electrode layer 1028, such as a polysilicon layer, is deposited on the gate dielectric layer. The gate dielectric and gate electrode layers may be formed by suitable techniques and thicknesses as described in FIG. 9c.

Figure 10D:
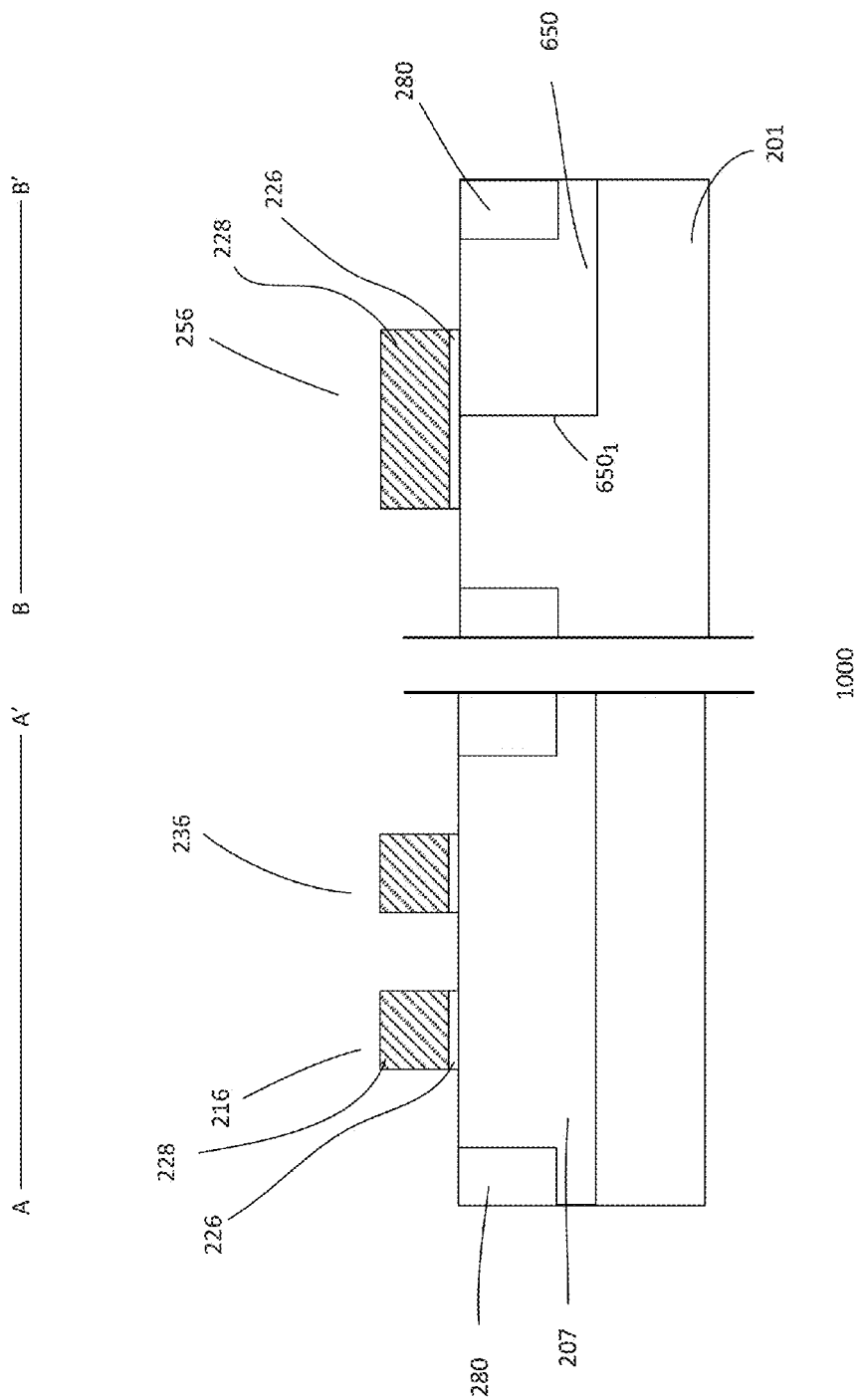

Referring to FIG. 10d, the process continues to pattern the gate dielectric and gate electrode layers. The gate electrode and gate dielectric layers are patterned to define gates of various devices. The patterned gate electrode and gate dielectric layers 228 and 226, in one embodiment, are configured such that the storage and control gates are commonly coupled while the access gate is separately defined as shown in FIGS. 6a-6b. For example, the storage and control gates 236 and 256 are defined by single or common gate electrode and gate dielectric layers extending across the first and second wells and the substrate region while the access gate 216 is defined separately on the second well. The control gate is also defined such that it partially overlaps the control well and partially overlaps the substrate region.

Figure 10E:
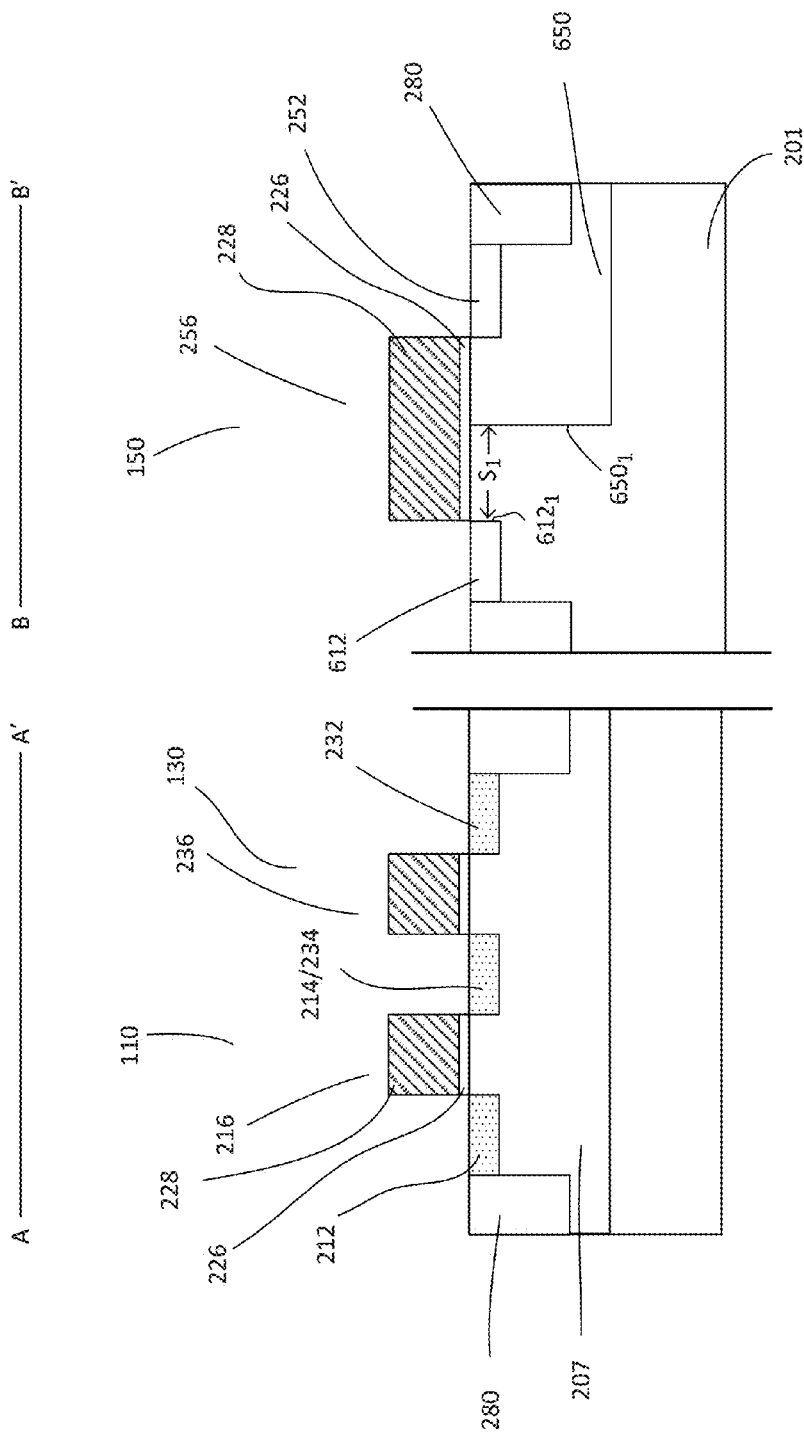

Diffusion extension regions (not shown) and gate sidewall spacers (not shown) are formed. In one embodiment, exposed substrate regions adjacent to the sidewall spacers are heavily doped with first, or second polarity type dopants to form transistor S/D regions 212, 214, 232 and 234, erase S/D region 612 and control contact region 252 as shown in FIG. 10e. Ion implantation technique may be employed to form the transistor S/D regions, erase S/D region and control contact region with suitable dopant concentrations and depth dimensions as described with respect to FIGS. 6a-6b. An anneal may be performed thereafter to activate the dopants. This completes formation of the transistors 110 and 130 and capacitor 150.

Figure 10F:
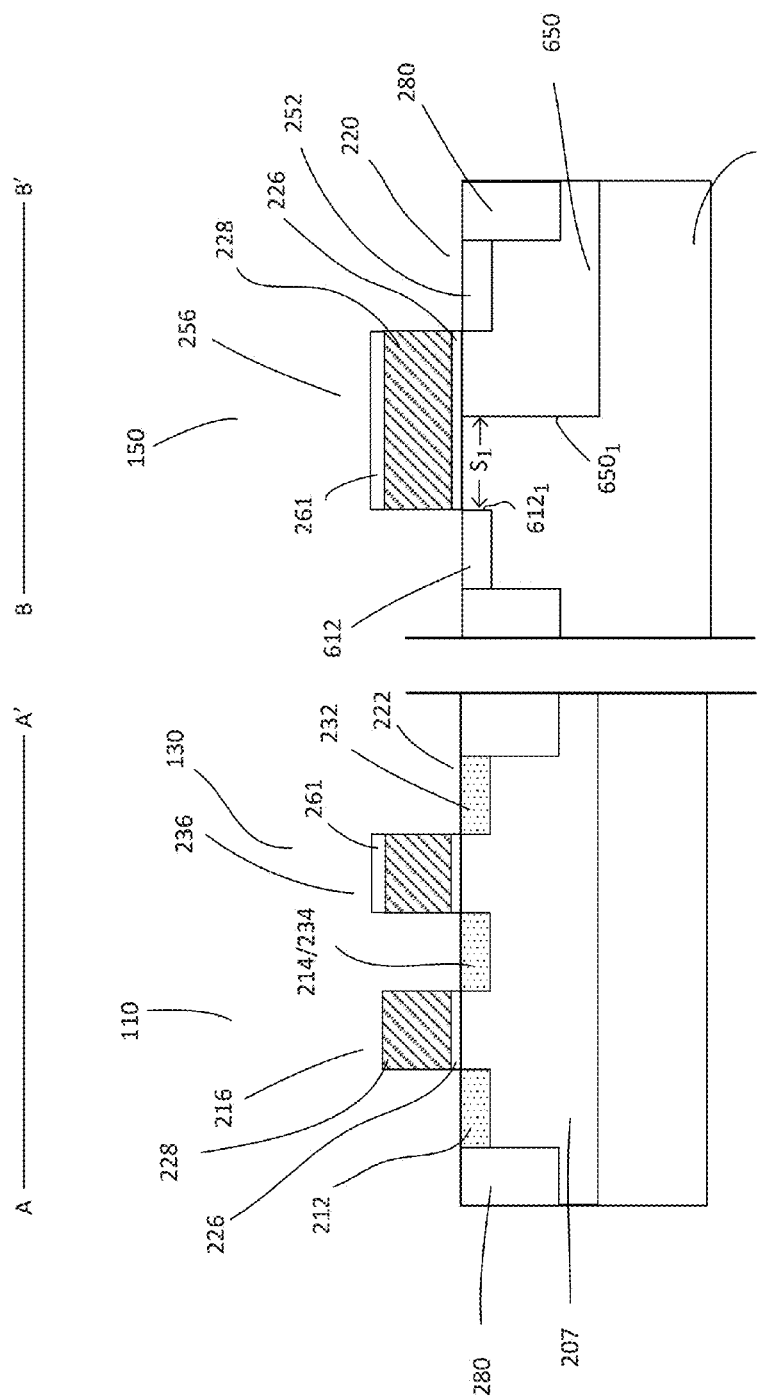

The process may continue to form a silicide block 261 over the storage and control gates as shown in FIG. 10f. Metal silicide contacts (not shown) may be provided on contact regions of the memory cell. For example, metal silicide contacts are provided on the transistor S/D regions, active capacitor regions and the access gate. The metal silicide contacts may be formed by suitable techniques.

As described with respect to FIGS. 10a-10f above, the memory cell is formed without isolation well and HV well region. In one embodiment, the process as described in FIGS. 10a-10f may be modified to include formation of an isolation well 208 and HV well region 210 to form a memory cell as shown in FIG. 6c. For example, after formation of the STI regions, the process continues to form the isolation well and HV well region. Techniques for forming isolation well and HV well region are the same as that described in FIG. 9b. In such case, an implant mask is used to define the transistor well and another implant mask covering the transistor well and a portion of the HV well region adjacent to the transistor well is used to form the control well such that it is displaced away from the transistor well by the portion of the HV region. The process then continues from FIGS. 10c-10f until a memory cell shown in FIG. 6c is formed.

The processes as described in FIGS. 9a-9f and FIGS. 10a-10f result in advantages. The memory cells as formed include similar or all advantages as described in FIGS. 1, 2a-2b, 5 and 6a-6c. In addition, the processes as described are highly compatible with the CMOS processing platform. The processes as described may use the same masks which are used in CMOS processing and no new mask is required to form the memory cells. Thus, a simplified and cost-free MTP memory cell together with CMOS devices can be achieved.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile (NV) multi-time programmable (MTP) memory cell comprising:
   a substrate;
   a first transistor having a select gate and a second transistor having a floating gate adjacent to one another and disposed over a transistor well, the transistors comprise first and second S/D regions disposed adjacent to the sides of the gates;
   a control gate disposed on the substrate and over a control well, wherein the control gate is coupled to the floating gate and the control and floating gates comprise the same gate layer extending across the control and transistor wells, the control gate comprises a control capacitor; and
   an erase terminal, wherein the erase terminal is decoupled from the control capacitor and transistors.

2. The memory cell of claim 1 comprising a control contact region disposed within the control well, wherein the control well and control contact region comprise first polarity type dopants, and the transistor well comprises second polarity type dopants opposite to the first polarity type.

3. The memory cell of claim 1 comprising an isolation well and a high voltage (HV) well region disposed in the substrate, wherein the HV well region is disposed within the isolation well, the HV well region encompasses the control well and transistor well.

4. The memory cell of claim 3 wherein the isolation well and control well are of a first polarity type, and the HV well region and transistor well are of a second polarity type different from the first polarity type.

5. The memory cell of claim 4 wherein the erase terminal comprises an erase gate disposed over an erase well, the erase gate comprises an erase capacitor.

6. The memory cell of claim 5 wherein the HV well region encompasses the erase well, control well and transistor well.

7. The memory cell of claim 6 wherein:
   the erase, control and floating gates comprise the same gate layer extending across the erase, control and transistor wells; and
   wherein the erase well is of the first polarity type and the transistor well is of the second polarity type.

8. The memory cell of claim 1 wherein:
   the erase terminal comprises an erase S/D region disposed in the substrate adjacent to a second side of the control gate, wherein a control contact region is disposed in the substrate adjacent to a first side of the control gate; and
   the control well encompasses the control contact region and underlaps a portion of the control gate.

9. The memory cell of claim 8 comprising a high voltage (HV) well region disposed in the substrate, wherein the HV well region encompasses the erase S/D region, control well and transistor well.

10. The memory cell of claim 1 comprising a control contact region disposed within the control well, wherein the control contact region couples the control well to a control gate line (CGL) and is biased at a bias potential during various operations of the memory cell.

11. The memory cell of claim 2 wherein:
    the erase terminal comprises an erase S/D region disposed in the substrate adjacent to a second side of the control gate; and
    the control contact region is disposed adjacent to a first side of the control gate.

12. The memory cell of claim 11 wherein the control well encompasses the control contact region and underlaps a portion of the control gate, wherein the control well is displaced away from the erase S/D region.

13. A non-volatile (NV) multi-time programmable (MTP) memory cell comprising:
    a substrate;
    a first transistor having a select gate and a second transistor having a floating gate adjacent to one another and disposed over a transistor well, the transistors comprise first and second S/D regions disposed adjacent to the sides of the gates;
    a control gate disposed over a control well, wherein the control gate is coupled to the floating gate and the control and floating gates comprise the same gate layer extending across the transistor and control wells, the control gate comprises a control capacitor, and the control well encompasses at least a control contact region disposed in the substrate adjacent to a first side of the control gate; and an erase terminal, wherein the erase terminal is decoupled from the control capacitor and transistors.

14. The memory cell of claim 13 wherein the control well and control contact region comprise first polarity type dopants, and the transistor well comprises second polarity type dopants opposite to the first polarity type.

15. The memory cell of claim 13 wherein the erase terminal comprises an erase gate disposed over an erase well, the erase gate comprises an erase capacitor.

16. The memory cell of claim 15 comprising an isolation well and a high voltage (HV) well region disposed in the substrate, wherein the HV well region is disposed within the isolation well, the HV well region encompasses the erase well, control well and transistor well.

17. The memory cell of claim 13 wherein:
the erase terminal comprises an erase S/D region disposed in the substrate adjacent to a second side of the control gate; and
the control well underlaps a portion of the control gate, wherein the erase S/D region is isolated from the control well.

18. The memory cell of claim 17 wherein the erase S/D region is isolated from the control well by an intrinsically doped substrate region.

19. The memory cell of claim 17 comprising a high voltage (HV) well region disposed in the substrate, wherein the HV well region encompasses the erase S/D region, control well and transistor well, and wherein the erase S/D region is isolated from the control well by a portion of the HV well region.

20. A non-volatile (NV) multi-time programmable (MTP) memory cell comprising:
a substrate;
a first transistor having a select gate and a second transistor having a floating gate adjacent to one another and disposed over a transistor well, the transistors comprise first and second S/D regions disposed adjacent to the sides of the gates;
a control gate disposed over a control well, wherein the control gate is coupled to the floating gate, the control gate comprises a control capacitor;
a control contact region disposed in the substrate and adjacent to a first side of the control gate, wherein the control well encompasses the control contact region and underlaps a portion of the control gate, the control well and control contact region comprise first polarity type dopants; and
an erase terminal, wherein the erase terminal is decoupled from the control capacitor and transistors, the erase terminal comprises an erase S/D region disposed in the substrate adjacent to a second side of the control gate.

* * * * *